United States Patent
Pai et al.

(10) Patent No.: US 6,742,247 B2
(45) Date of Patent: Jun. 1, 2004

(54) PROCESS FOR MANUFACTURING LAMINATED HIGH LAYER COUNT PRINTED CIRCUIT BOARDS

(75) Inventors: Deepak K. Pai, Burnsville, MN (US); Ronald R. Denny, Minneapolis, MN (US)

(73) Assignee: General Dynamics Advanced Information Systems, Inc., Arlington, VA (US)

( * ) Notice: Subject to any disclaimer, the term of this patent is extended or adjusted under 35 U.S.C. 154(b) by 0 days.

(21) Appl. No.: 10/387,871

(22) Filed: Mar. 14, 2003

(65) Prior Publication Data

US 2003/0174484 A1 Sep. 18, 2003

Related U.S. Application Data

(60) Provisional application No. 60/363,935, filed on Mar. 14, 2002.

(51) Int. Cl.$^7$ ................................................ H05K 3/00
(52) U.S. Cl. .............................. 29/829; 29/846; 29/830; 29/831; 29/840; 29/852; 174/255; 174/262; 174/264
(58) Field of Search .................... 29/846, 830, 829, 29/838, 852, 840, 841; 174/255, 259, 264, 262; 257/700, 758, 774, 723; 438/118, 125, 612

(56) References Cited

U.S. PATENT DOCUMENTS

| | | |
|---|---|---|
| 5,046,238 A | 9/1991 | Diagle et al. |
| 5,276,955 A | 1/1994 | Noddin et al. |
| 5,786,238 A | 7/1998 | Pai et al. |
| 5,953,816 A * | 9/1999 | Pai et al. .................. 29/830 |
| 5,977,490 A | 11/1999 | Kawakita et al. |
| 5,986,339 A | 11/1999 | Pai et al. |
| 6,139,777 A | 10/2000 | Omoya et al. |
| 6,320,140 B1 | 11/2001 | Enomoto |
| 6,573,460 B2 * | 6/2003 | Roeter et al. ............ 174/262 |

FOREIGN PATENT DOCUMENTS

| | | | |
|---|---|---|---|
| JP | 10-190225 | * | 7/1998 |
| WO | WO 9836624 | | 8/1998 |

OTHER PUBLICATIONS

Deepak K. Pai, "An Approach to Fabricate High Density, Large-Layer-Count PWB," presented at the Printed Circuits Expo 2000, Apr. 2–6, 2000, San Diego, California, pp. S09-2-1 to S09-2-4.

Deepak K. Pai, "An Approach to Fabricate High Density, Large-Layer-County PWB," Design Technical Journal, vol. 2, No. 2, Spring/Summer 2000, pp. 16–18.

Deepak K. Pai, "An Approach to Fabricate High Density, Large-Layer-County PWB," Surface Mount Technology Association (SMTA) International Proceedings 2001, Sep. 30–Oct. 4, 2001, pp. 569–579.

International Search Report for Application No. PCT/US03/07842 dated Sep. 23, 2003.

* cited by examiner

Primary Examiner—Minh Trinh
(74) Attorney, Agent, or Firm—Hunton & Williams LLP

(57) ABSTRACT

The present invention provides a number of techniques for laminating and interconnecting multiple high-layer-count (HLC) substrates to form a multilayer package or other circuit component. A solder bump may be formed on the conductive pad of at least one of two HLC substrates. The solder bump preferably is formed from an application of solder paste to the conductive pad(s). An adhesive film may be positioned between the surfaces of the HLC substrates having the conductive pads, where the adhesive film includes an aperture located substantially over the conductive pads such that the conductive pads and/or solder bumps confront each other through the aperture. The HLC substrates then may be pressed together to mechanically bond the two substrates via the adhesive. The solder bump(s) may be reflowed during or after the lamination to create a solder segment that provides an electrical connection between the two conductive pads through the aperture in the adhesive film.

18 Claims, 22 Drawing Sheets

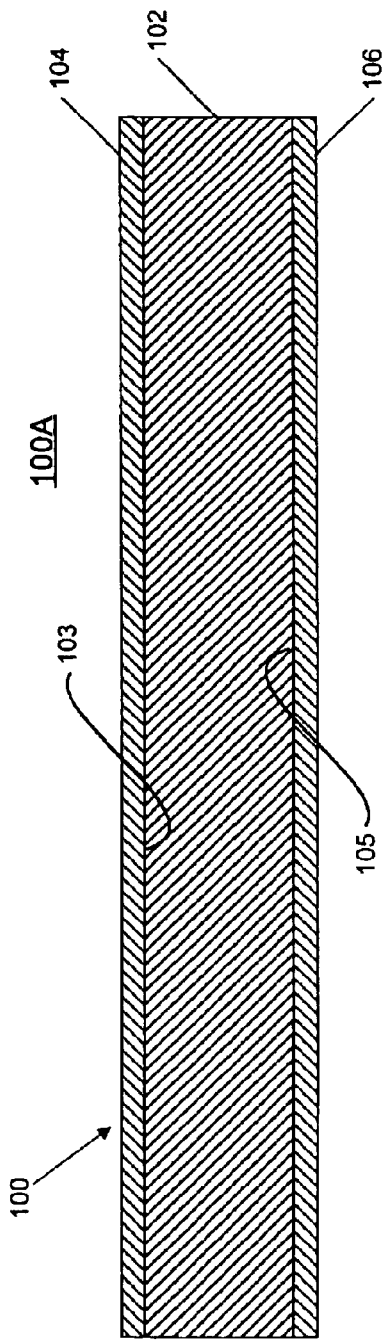
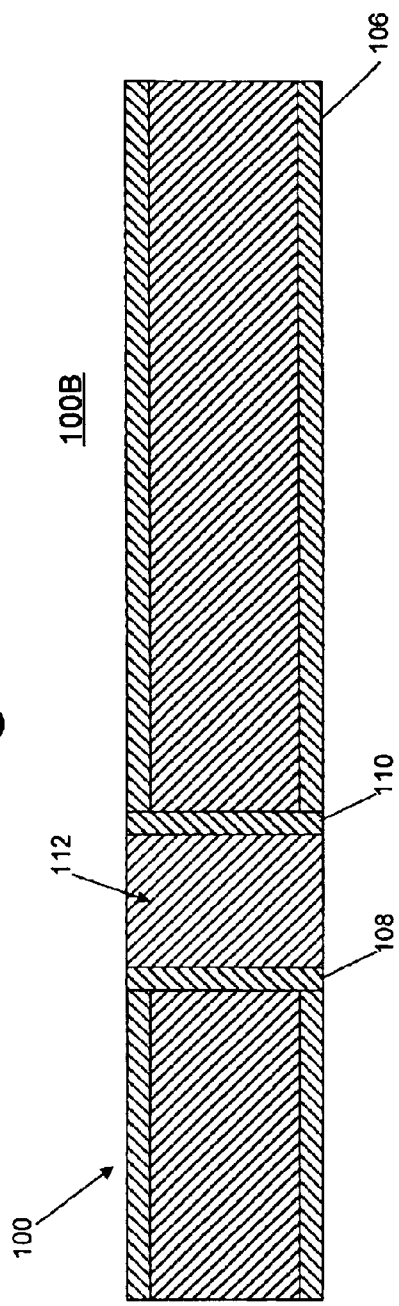

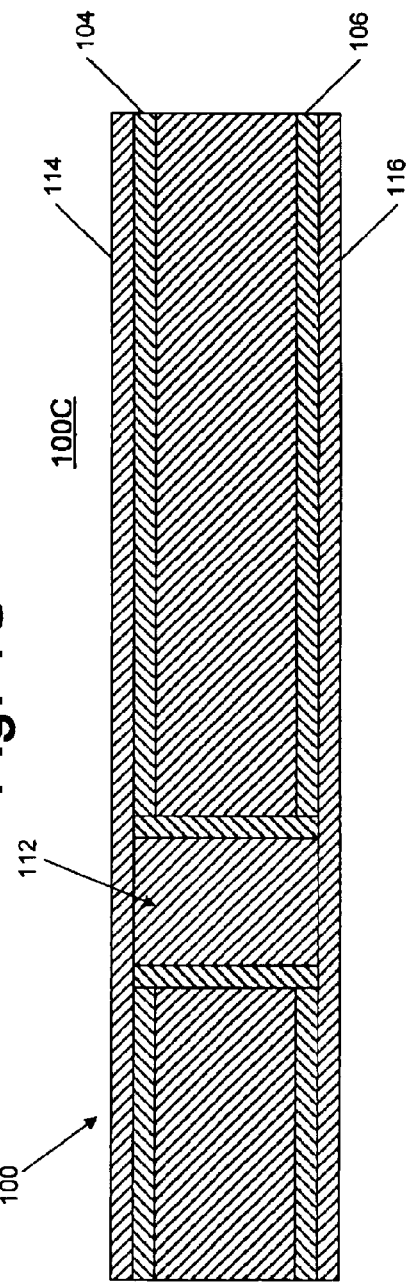
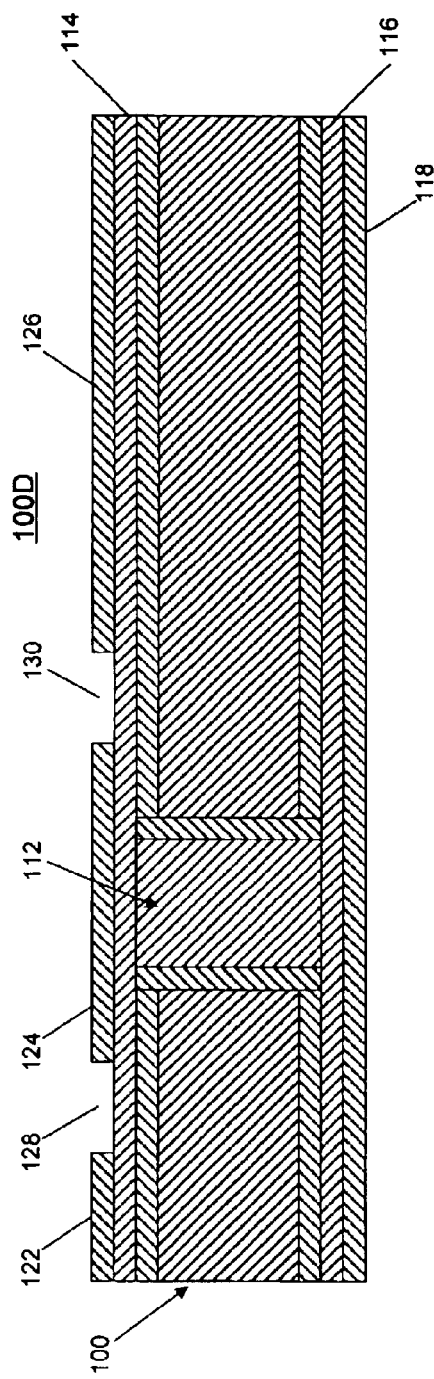

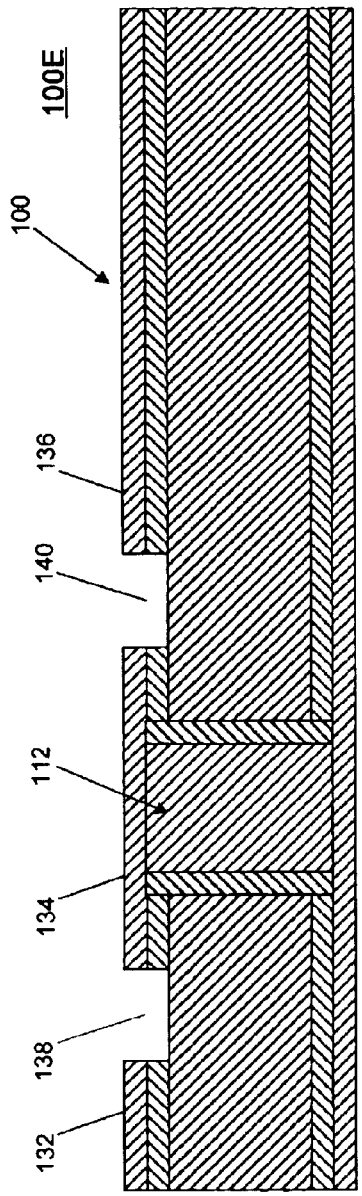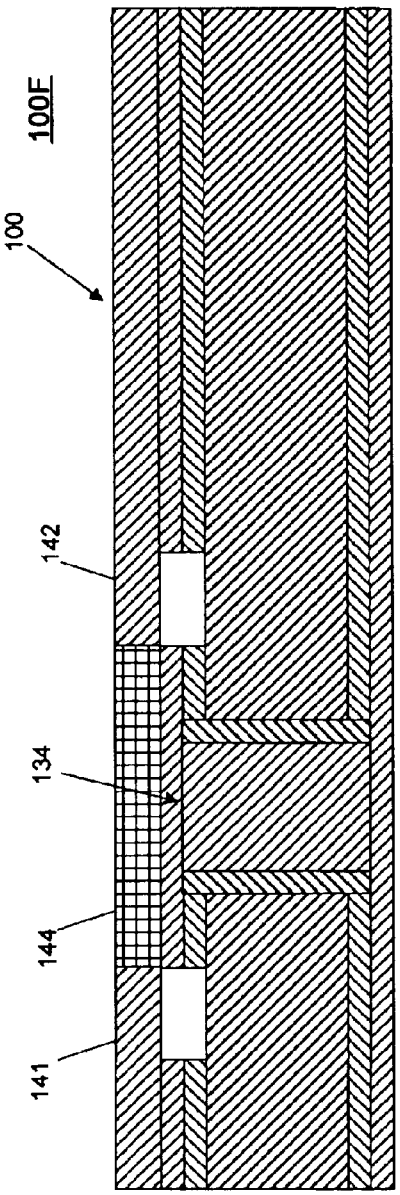

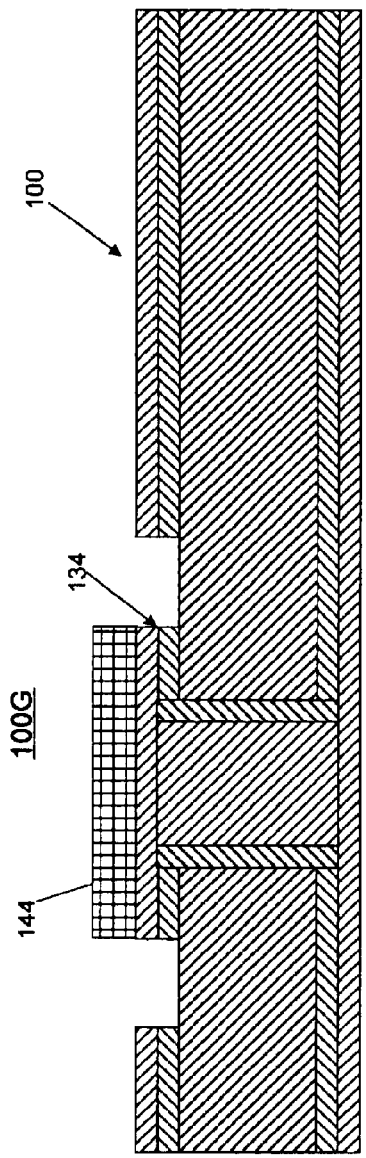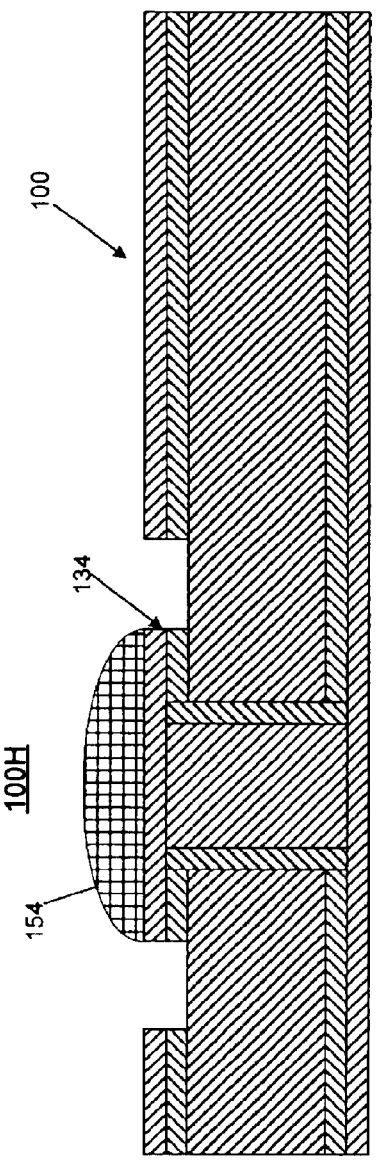

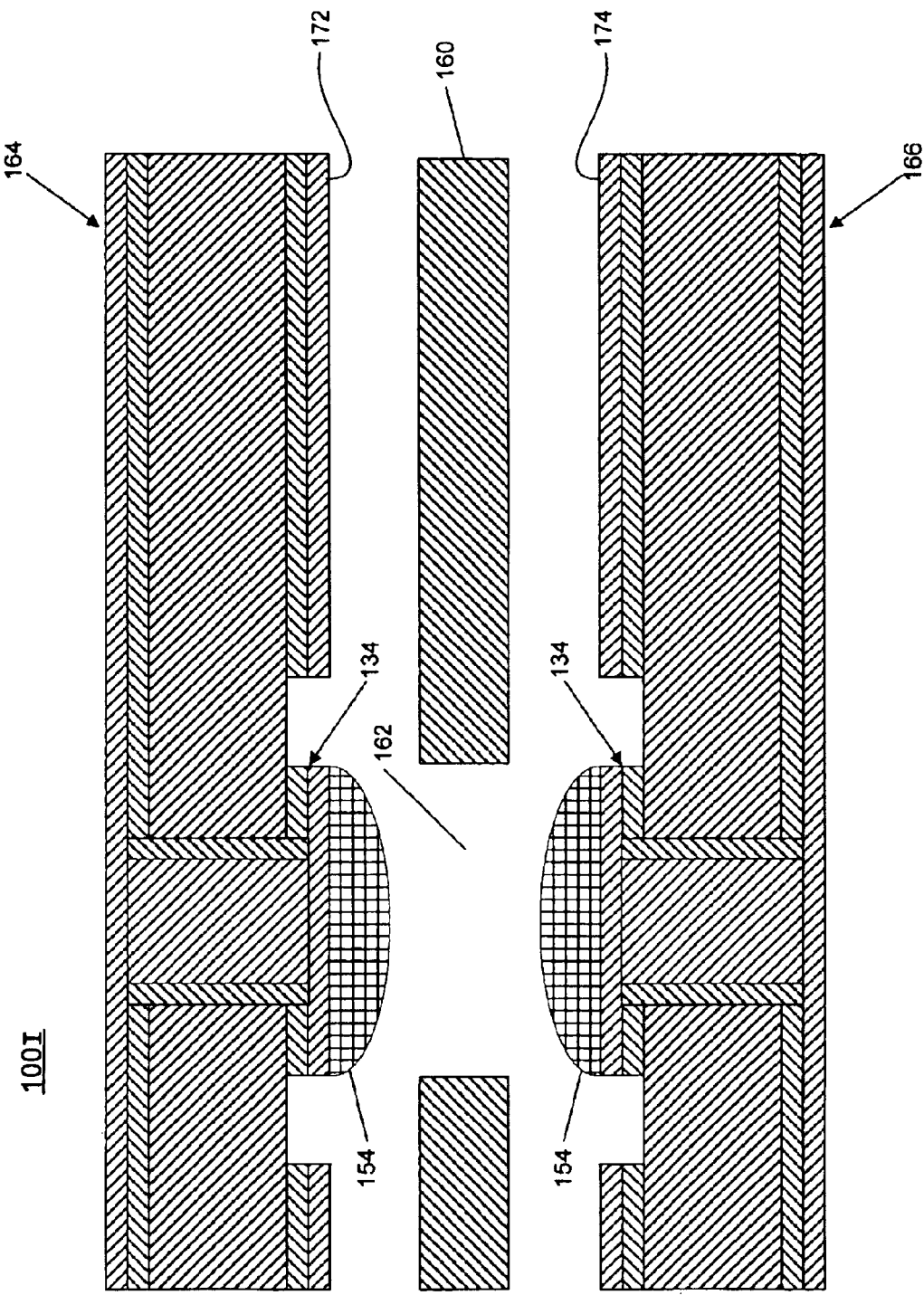

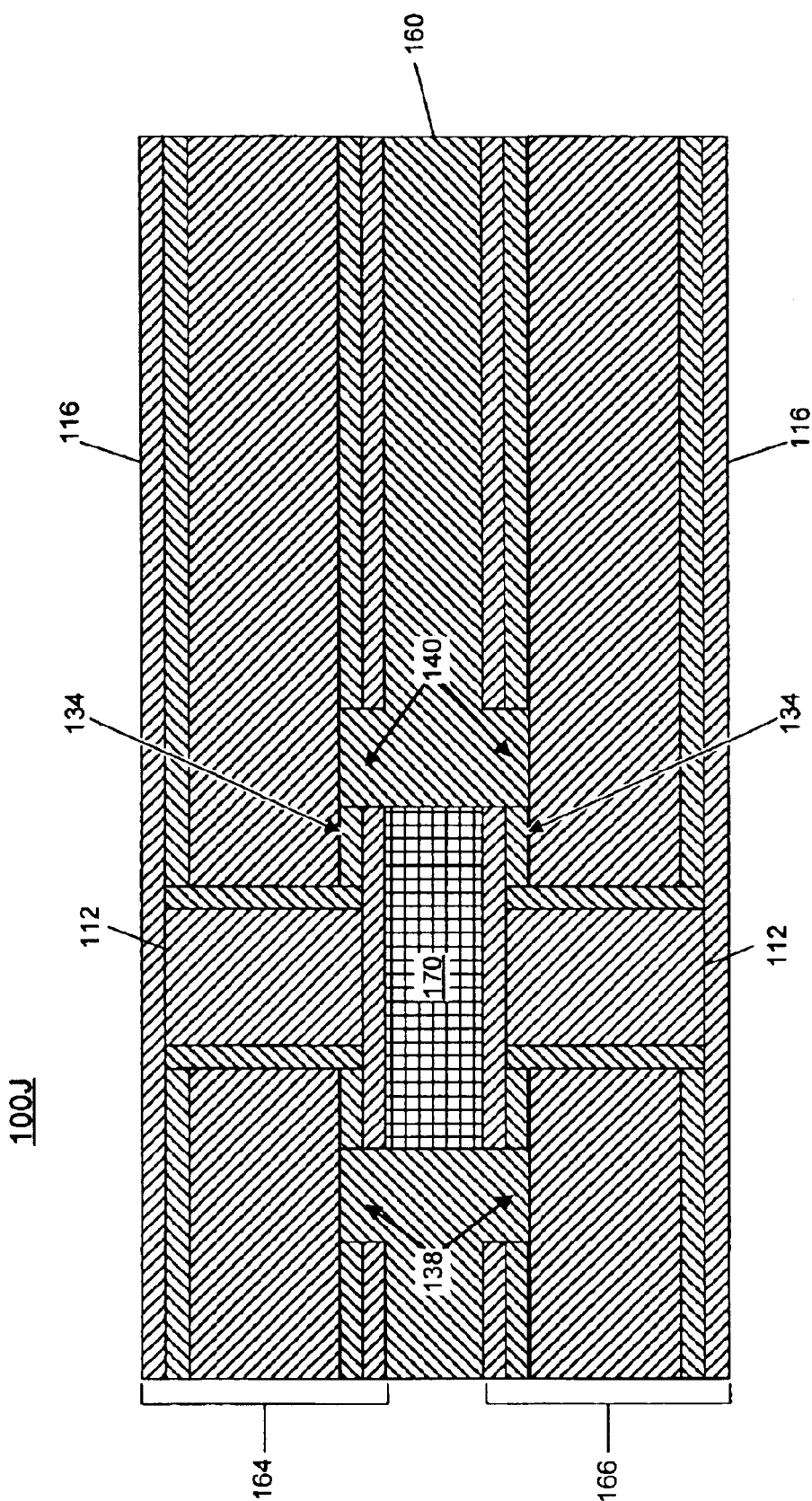

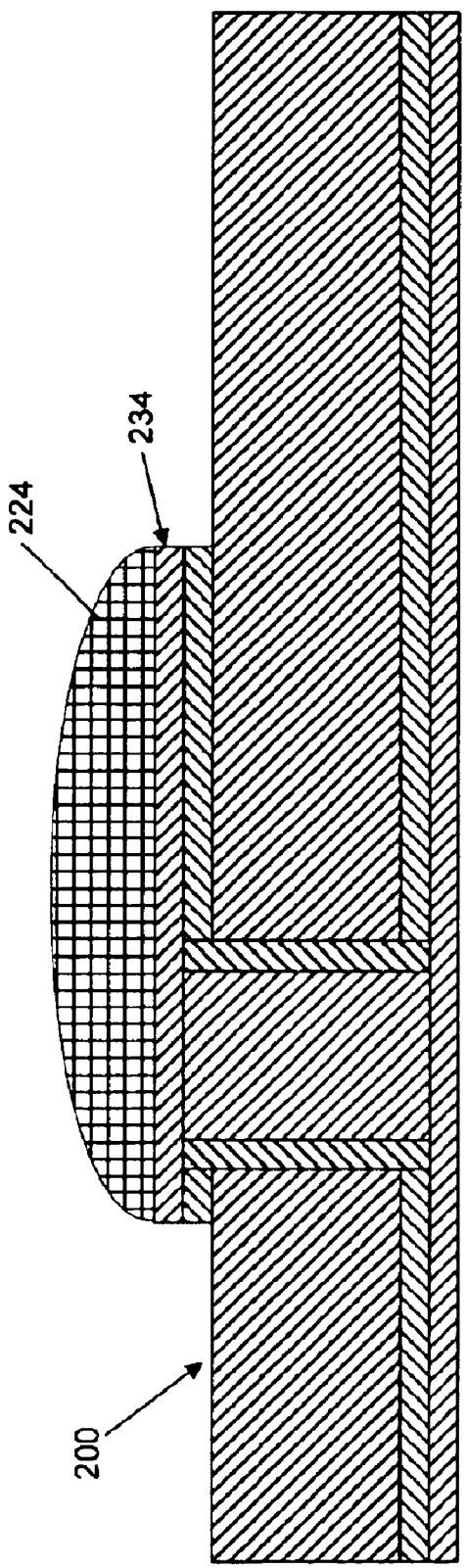

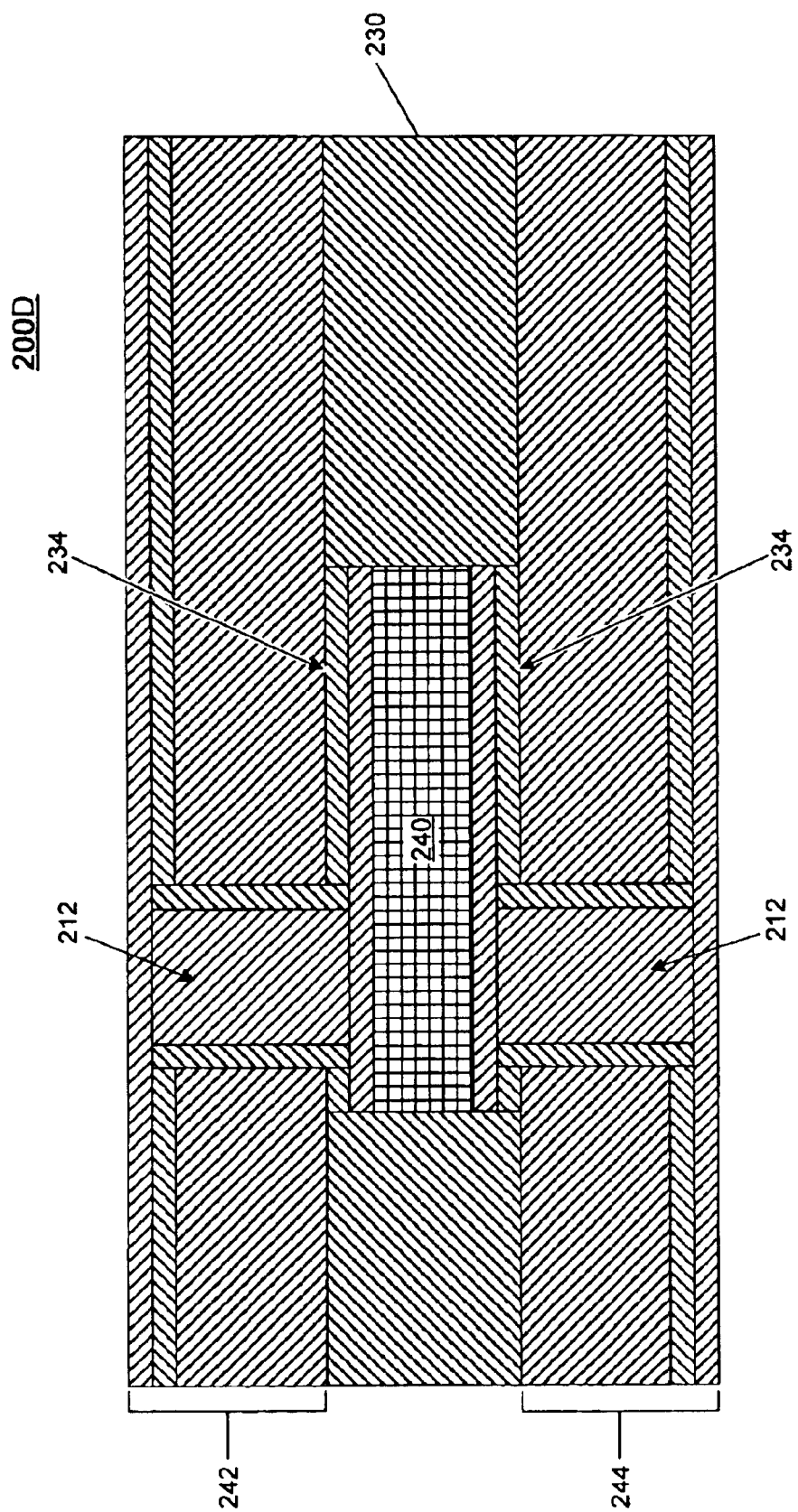

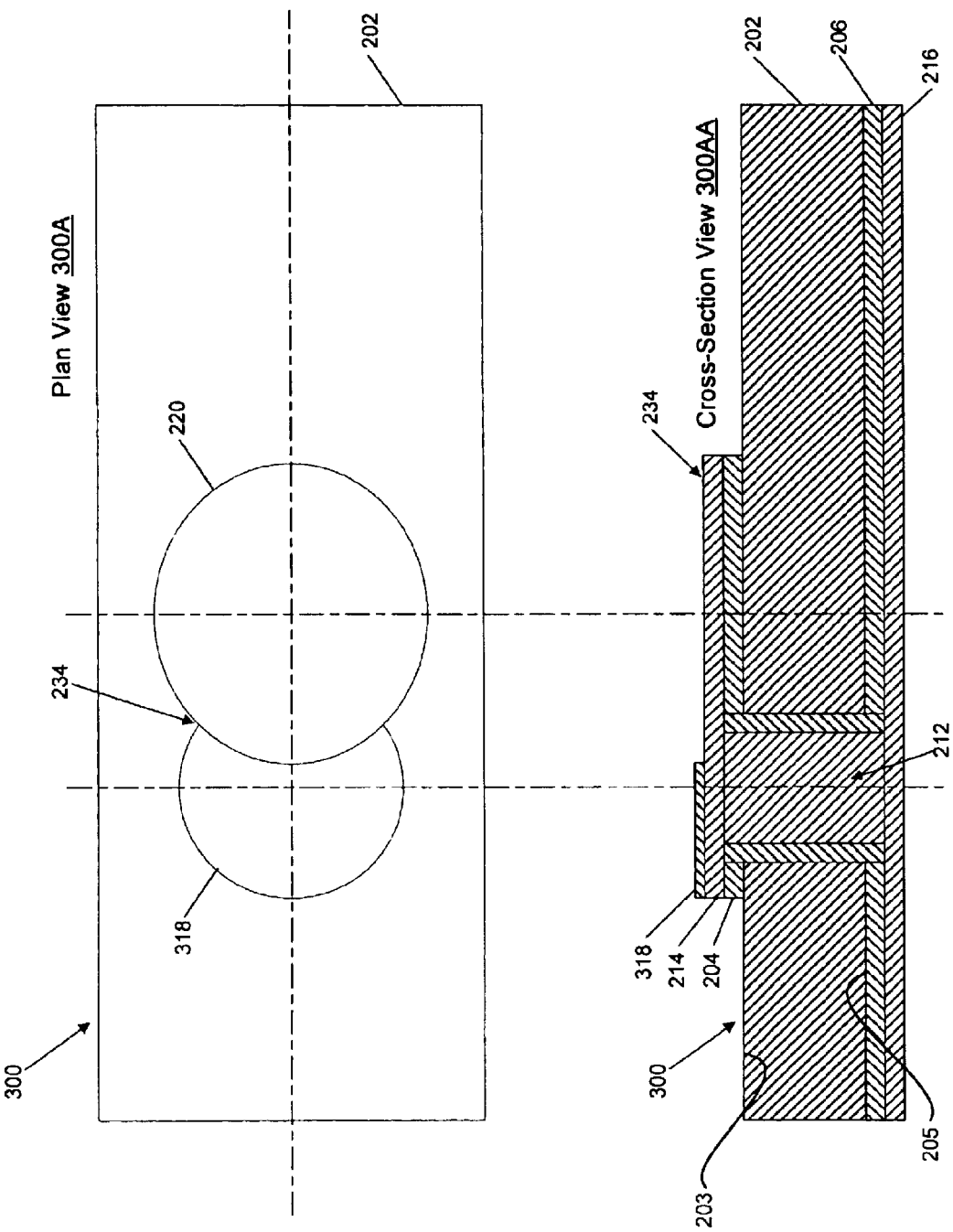

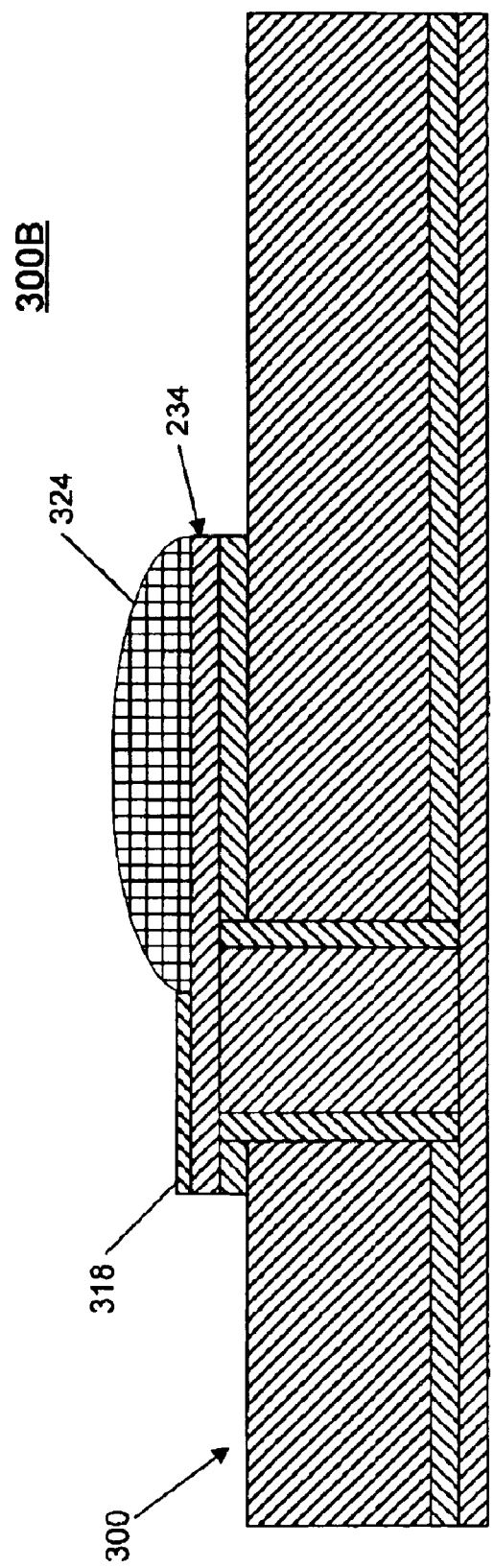

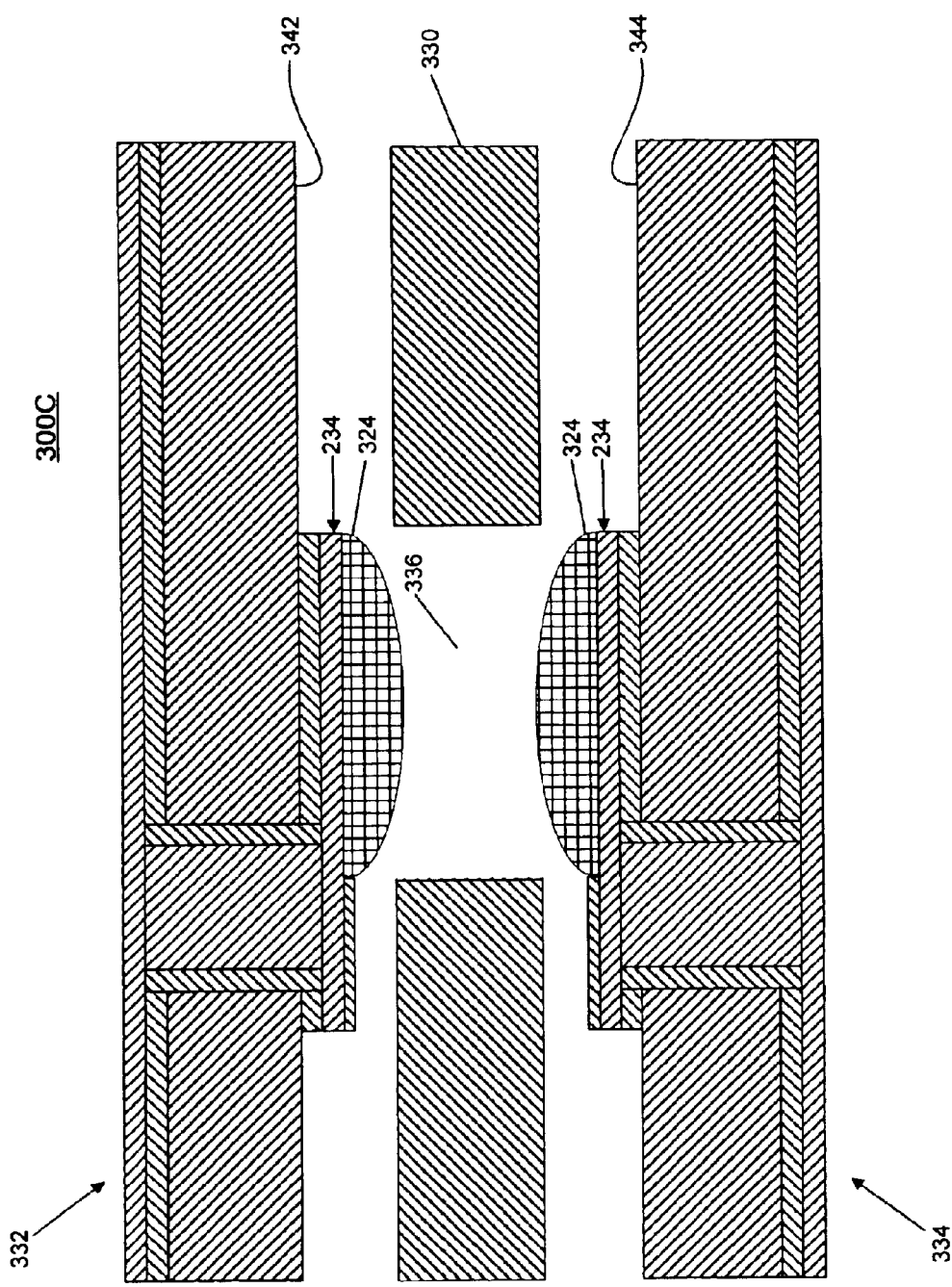

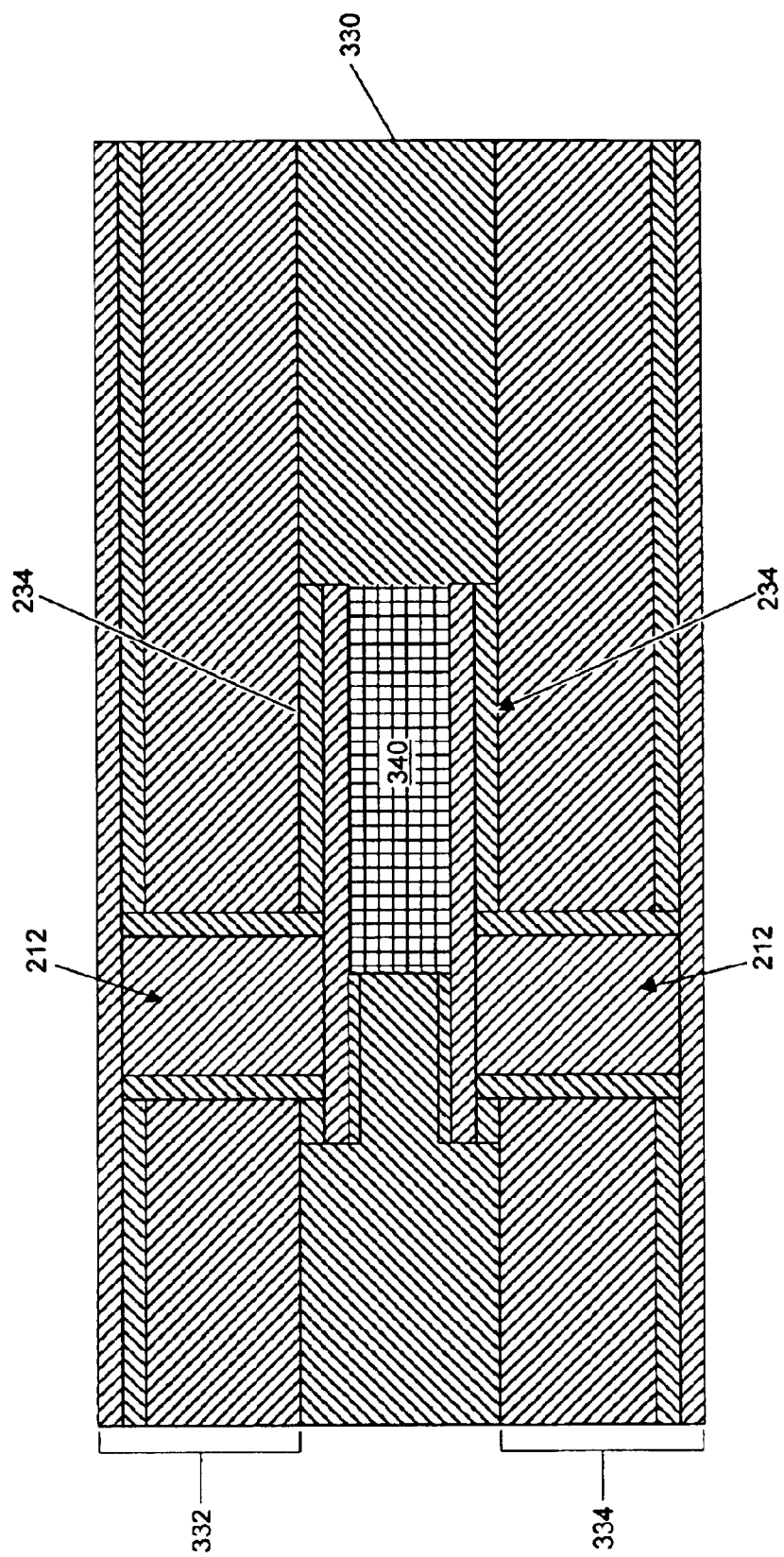

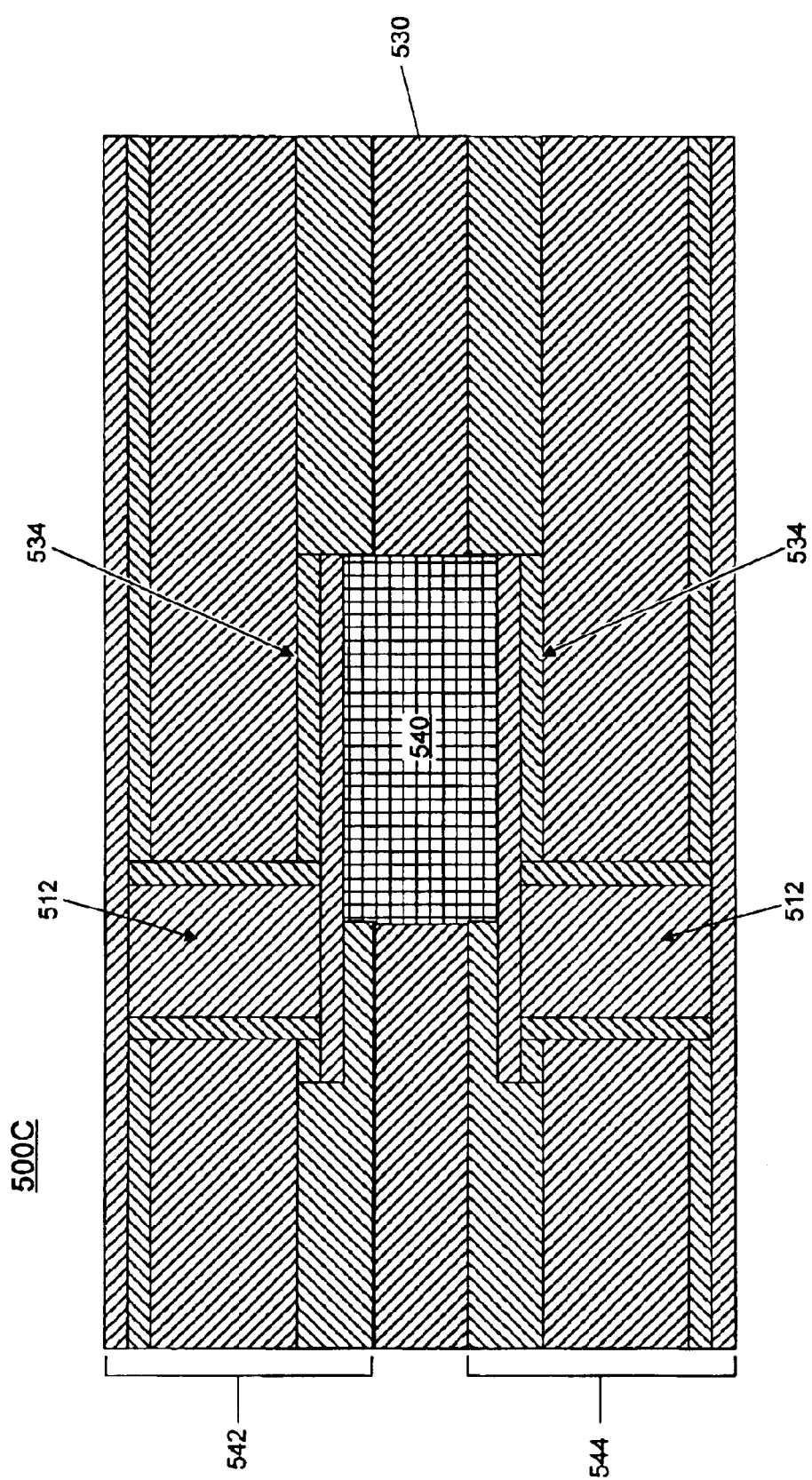

PROCESS FOR MANUFACTURING LAMINATED HIGH LAYER COUNT PRINTED CIRCUIT BOARDS

CROSS REFERENCE TO RELATED APPLICATIONS

Priority is claimed based on U.S. Provisional Application No. 60/363,935 entitled "Large Layer Count Lamination PWB Fabrication Technology," filed Mar. 14, 2002.

FIELD OF THE INVENTION

The present invention relates generally to a process for laminating high-layer-count (HLC) substrates and more particularly to a process for manufacturing a multilayer package of at least two HLC substrates having reliable electrical and mechanical connections.

BACKGROUND OF THE INVENTION

The advent of high-density circuits has spurred the development and implementation of high-layer-count (HLC) printed wiring boards (PWBs) having multilayer substrates. While multilayer substrates typically offer the advantage of more efficient use of space in a circuit board design, multilayer substrates typically require more complex connection capabilities and circuit modularity. These complexities give rise to several problems. For one, relatively large drills often are required to form via holes, or "vias," for connecting two or more HLC substrates to one another. Further, the alignment of layers and the potential for wander by the drill bit present serious obstacles to correct registration and connections between and among HLC substrates. Substrates with high aspect ratios introduce additional complications, as it generally is difficult to plate a via hole to connect multiple substrates without disturbing adjacent circuit features. Further, the interconnection between substrates typically cannot be easily repaired. As a result, the failure of a single connection may cause an entire multilayer package to be discarded as incurably defective.

In view of the problems presented in the use of HLC substrates (also known as large-layer-count substrates or LLC substrates) in multilayer packages, improved techniques for HLC lamination have been developed. For example, U.S. Pat. Nos. 5,786,238 and 5,986,339, both issued to Pai, et al., disclose techniques for HLC lamination based on plating copper and solder posts. While eliminating some of the problems discussed above, these techniques have a number of limitations. One such limitation includes the possibility of an electrical disconnect. It will be appreciated that the heights of plated posts on a large board often vary significantly from the edges to the center of the board despite the use of pulse plating processes and "thieving" features to enhance uniformity. Because of this height variation, some posts may fail to electrically connect with the counterpart on the opposing HLC substrate. These conventional techniques are also limited by the expense and time-requirements of the plating process, especially in small-batch production. It also will be appreciated that printed wiring boards (PWBs) with plated solder bumps typically are difficult to handle as solder slivers may separate from the plated bumps and cause problems in subsequent manufacturing operations unless the boards are reflowed to melt and secure the bumps.

Accordingly, an improved HLC laminating process would be advantageous.

SUMMARY OF THE INVENTION

The present invention mitigates or solves the above-identified limitations in known solutions, as well as other unspecified deficiencies in known solutions. A number of advantages associated with the present invention are readily evident to those skilled in the art, including economy of design and resources, transparent operation, cost savings, etc.

In accordance with one embodiment of the present invention, a multilayer package is provided. The multilayer package comprises a first high-layer-count (HLC) substrate including a first conductive pad and a first conductive layer disposed in the first HLC substrate and a first via extending through at least a portion of the first HLC substrate and providing an electrical connection between the first conductive pad and the first conductive layer. The multilayer package also comprises a second high-layer-count (HLC) substrate including a second conductive pad and a second conductive layer disposed in the second HLC substrate and a second via extending through at least a portion of the second HLC substrate and providing an electrical connection between the second conductive pad and the second conductive layer. The multilayer package further comprises an adhesive film disposed between the first HLC substrate and the second HLC substrate and having an aperture located at least in part between the first and second conductive pads, the adhesive film mechanically bonding the first HLC substrate and the second HLC substrate and a solder segment occupying at least a substantial portion of the aperture in the adhesive film and providing an electrical connection between the first conductive pad and the second conductive pad, the solder segment being formed at least in part by a reflow of solder paste applied to the first conductive pad.

In accordance with another embodiment of the present invention, a multilayer package is provided. The multilayer package comprises a first high-layer-count (HLC) substrate including a first conductive pad and a first conductive layer disposed in the first HLC substrate and a first via extending through at least a portion of the first HLC substrate and providing an electrical connection between the first conductive pad and the first conductive layer, wherein the first conductive pad is offset from an axis of the first via. The multilayer package further comprises a second high-layer-count (HLC) substrate including a second conductive pad and a second conductive layer disposed in the second HLC substrate and a second via extending through at least a portion of the second HLC substrate and providing an electrical connection between the second conductive pad and the second conductive layer. The multilayer package also comprises an adhesive film disposed between the first HLC substrate and the second HLC substrate and having an aperture located between the first and second conductive pads, the adhesive film mechanically bonding the first HLC substrate and the second HLC substrate and a solder segment occupying at least a substantial portion of the aperture in the adhesive film and providing an electrical connection between the first conductive pad and the second conductive pad, the solder segment being formed at least in part by a reflow of a solder bump formed on the first conductive pad.

In accordance with yet another embodiment of the present invention, a multilayer package is provided. The multilayer package comprises a first high-layer-count (HLC) substrate including a first conductive pad and a first conductive layer disposed in the first HLC substrate, the first conductive pad comprising a first pad section connected to a second pad section by a first connective portion and a first via extending through at least a portion of the first HLC substrate to the first pad section and providing an electrical connection between the first conductive pad and the first conductive layer. The multilayer package further comprises a second high-layer-count (HLC) substrate including a second conductive pad and a second conductive layer disposed on the second HLC substrate and a second via extending through at least a portion of the second HLC substrate and providing an electrical connection between the second conductive pad and the second conductive layer. The multilayer package additionally comprises an adhesive film disposed between the first HLC substrate and the second HLC substrate and having an aperture located substantially between the second pad section of the first conductive pad and the second conductive pad, the adhesive film mechanically bonding the first HLC substrate and the second HLC substrate and a solder segment occupying at least a substantial portion of the aperture in the adhesive film and providing an electrical connection between the first conductive pad and the second conductive pad, the solder segment being formed at least in part by a reflow of a solder bump formed on the second pad section.

In accordance with an additional embodiment of the present invention, a multilayer package is provided. The multilayer package comprises a first high-layer-count (HLC) substrate including a first conductive pad and a first conductive layer disposed in the first HLC substrate, an insulative layer disposed over at least a portion of the first conductive pad, the insulative layer including an aperture located over some but not all of the first conductive pad, and a first via extending through at least a portion of the first HLC substrate and providing an electrical connection between the first conductive pad and the first conductive layer. The multilayer package further comprises a second high-layer-count (HLC) substrate including a second conductive pad and a second conductive layer disposed in the second HLC substrate and a second via extending through at least a portion of the second HLC substrate and providing an electrical connection between the second conductive pad and the second conductive layer. The multilayer package also comprises an adhesive film disposed between the first HLC substrate and the second HLC substrate and having an aperture located substantially between the aperture in the insulative layer and the second conductive pad, the adhesive film mechanically bonding the first HLC substrate and the second HLC substrate and a solder segment occupying at least a substantial portion of the aperture in the adhesive film and providing an electrical connection between the first conductive pad and the second conductive pad, the solder segment being formed at least in part by a reflow of a solder bump formed on the second pad section.

In accordance with yet another embodiment of the present invention, a process for interconnecting at least two high-layer-count (HLC) laminates is provided. The process comprises the steps of forming a first via in a first HLC substrate and a second via in a second HLC substrate, the first via extending through at least a portion of the first HLC substrate to a bottom surface of the first HLC substrate and the second via extending through at least a portion of the second HLC substrate to a top surface of the second HLC substrate and forming a first conductive pad on the bottom surface of the first HLC substrate and a second conductive pad on the top surface of the second HLC substrate, the first conductive pad being in electrical contact with the first via and the second conductive pad being in electrical contact with the second via. The process further comprises the steps of applying solder paste to a surface of the first conductive pad, reflowing the solder paste to form a first solder bump on the first conductive pad and positioning an adhesive film between the bottom surface of the first HLC substrate and the top surface of the second HLC substrate, the adhesive film having an aperture substantially located between the first solder bump and the second conductive pad. The process further comprises the steps of pressing the first HLC substrate and the second HLC substrate together to adhere at least a portion of the bottom surface of the first HLC substrate to at least a portion of the top surface of the second HLC substrate and where the first solder bump occupies at least a portion of the aperture in the adhesive film and reflowing the first solder bump to form at least part of a solder segment providing an electrical connection between the first and second conductive pads.

BRIEF DESCRIPTION OF THE DRAWINGS

The purpose and advantages of the present invention will be apparent to those of ordinary skill in the art from the following detailed description in conjunction with the appended drawings in which like reference characters are used to indicate like elements, and in which:

FIGS. 1A–1J are cross-sectional diagrams of various manufacturing stages of an exemplary multilayer package illustrating a process of laminating and interconnecting multiple substrates by forming a solder bump substantially coaxial with a via in accordance with at least one embodiment of the present invention.

FIGS. 2A–2D are plan and cross-sectional diagrams of various manufacturing stages of an exemplary multilayer package illustrating a process of laminating and interconnecting multiple substrates by forming a solder bump offset from a via in accordance with at least one embodiment of the present invention.

FIGS. 3A–3D are plan and cross-sectional diagrams of various manufacturing stages of an exemplary multilayer package illustrating a process of laminating and interconnecting multiple substrates by forming a solder bump offset from a via using solder resist material in accordance with at least one embodiment of the present invention.

FIGS. 5A–5C are plan and cross-sectional diagrams of various manufacturing stages of an exemplary multilayer package illustrating a process of laminating and interconnecting multiple substrates by forming a solder bump offset from a via using dielectric material in accordance with at least one embodiment of the present invention.

DETAILED DESCRIPTION OF THE INVENTION

Figure 2A:
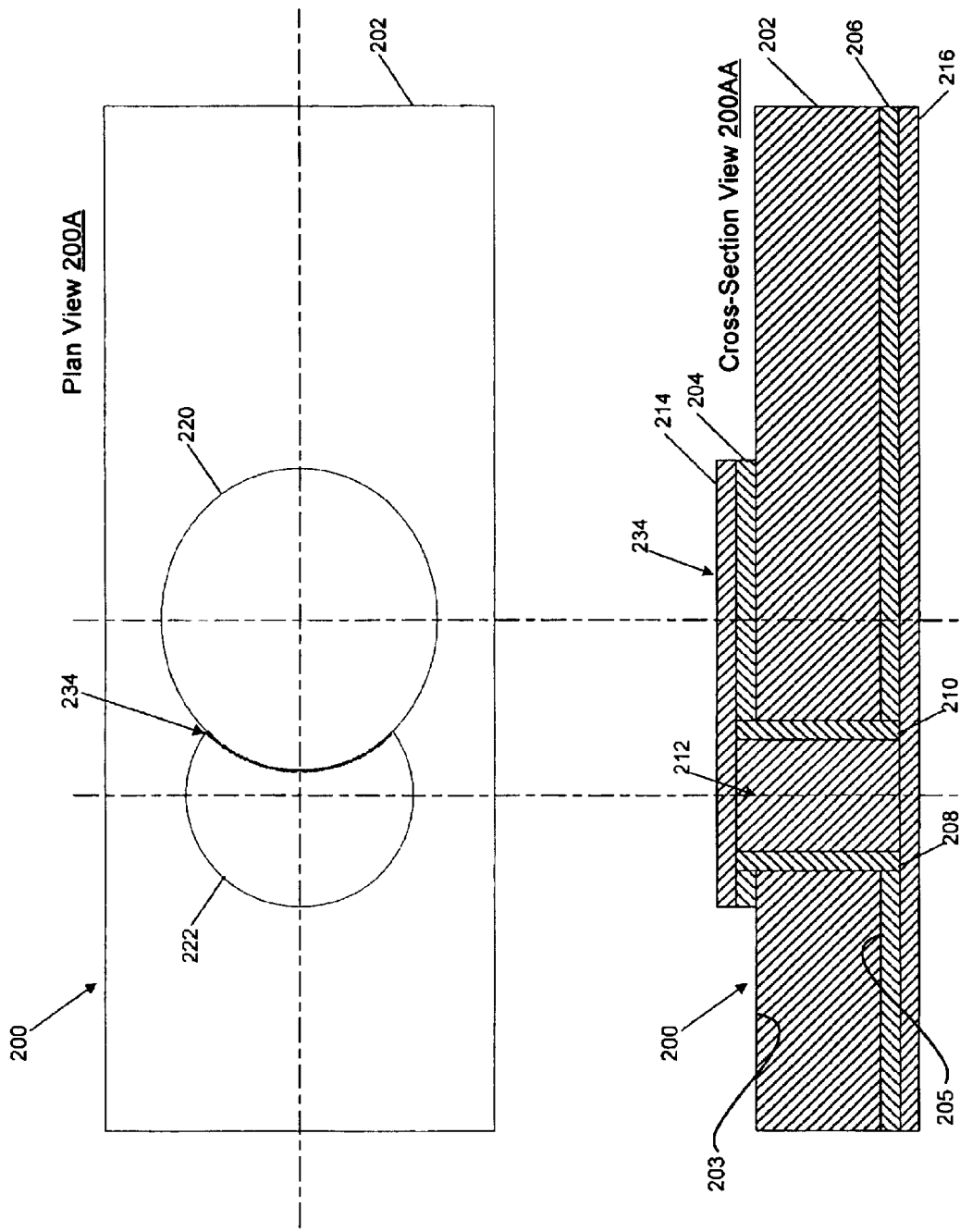

The following description is intended to convey a thorough understanding of the present invention by providing a number of specific embodiments and details involving the lamination and interconnection of multiple HLC substrates. It is understood, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

FIGS. 1A–6B illustrate exemplary techniques for laminating and interconnecting multiple HLC substrates to form a multilayer package or other circuit component. Note that certain features of FIGS. 1A–6B may be exaggerated in relation to other features for ease of illustration. In at least one embodiment, a solder bump may be formed on the conductive pad of at least one of two HLC substrates. The solder bump preferably is formed from an application of solder paste to the conductive pad(s). An adhesive film, such as low-flow or non-flow B-stage adhesive, may be positioned between the surfaces of the HLC substrates having the conductive pads, where the adhesive film includes an aperture located substantially over the conductive pads such that the conductive pads and/or solder bumps confront each other through the aperture. The HLC substrates then may be pressed together to mechanically bond the two substrates via the adhesive. The solder bump(s) may be reflowed during or after the lamination to create a solder segment that provides an electrical connection between the two conductive pads through the aperture in the adhesive film. The solder bumps and conductive pads may be formed in any of a variety of ways, a number of which are discussed below. Those skilled in the art, using the guidelines provided herein, may utilize other solder bump/conductive pad forms to laminate and interconnect HLC substrates without departing from the spirit or the scope of the present invention.

Although the following exemplary lamination and interconnect techniques describe the use of reflowed solder paste to form solder bumps, other suitable techniques may be applied. For example, in at least one embodiment, the interconnect techniques may implement solder posts rather than solder bumps, where the solder posts may be formed by plating a pad with one or more conductive materials, such as copper, tin, lead, and solder alloy. Exemplary techniques for forming such solder posts are described in U.S. Pat. Nos. 5,786,238 and 5,986,339, both entitled "Laminated Multilayer Substrates" and filed Feb. 13, 1997 and Jul. 14, 1998, respectively, the disclosures of which are incorporated herein.

Referring now to FIGS. 1A–1J, an exemplary process for laminating and interconnecting at least two HLC substrates using solder bumps substantially coaxial with vias is illustrated in accordance with at least one embodiment of the present invention. FIG. 1A illustrates cross-section view 100A of a HLC substrate 100 comprising one or more conductive, insulating and/or semiconductive layers 102 that have been patterned and interconnected to form part of an overall circuit. For ease of discussion, reference to the HLC substrate 100 collectively refers to the layers 102 and any subsequent additions to, or modifications of, the layers 102, such as, for example, the application of conductive layers to one or more surfaces and/or the formation of a via or a conductive pad (as described in detail below).

While any of a variety of HLC substrates may be utilized, a typical HLC substrate 100 may include a substrate having 20 to 30 layers, being 0.110 inches to 0.150 inches thick and up to 26 inches wide and 36 inches long. Any of a variety of materials may be used in the HLC substrate 100, such as FR4, high Tg FR4, bismaleimide triazine (BT), cyanate ester, polymide, and the like.

In one embodiment, conductive material may be applied to at least a portion of the top surface (top surface 103) of the layers 102 to form a conductive layer 104. Conductive material also may be applied to at least a portion of the bottom surface (bottom surface 105) of the layers 102 to form a conductive layer 106. The conductive layers 104, 106 may comprise any of a plurality of conductive materials, such as various types of metals (e.g., copper, aluminum, silver, gold, and nickel), metal alloys (e.g., tin-lead alloy), metal-filled epoxies, or a combination thereof. In a preferred embodiment, the conductive layers 104, 106 each comprise a layer of copper. The conductive layers 104, 106 typically would be about 0.0075 inches thick if copper is used, although other thickness may be used in accordance with at least one embodiment of the present invention.

It will be appreciated that the terms top surface and bottom surface are relative and reference to these terms is used for illustrative purposes. Unless otherwise specified, reference to the top or bottom surface refers to the corresponding surface of the outermost layer of the HLC substrate at the given point in the manufacturing process. For example, prior to application of the conductive layers 104, 106, reference to the top and bottom surfaces of the HLC substrate 100 refers to the top and bottom surfaces of the layers 102. After the application of the conductive layers 104, 106, however, reference to the top and bottom surfaces of the HLC substrate 100 refers to the external surface of the conductive layers 104, 106, respectively. Further, the top and/or bottom surfaces may include the external surfaces of more than one feature of the HLC substrate. For example, as discussed below, a conductive pad may be formed on top of the layers 102. In this case, the top surface of the HLC substrate 100 may include the external surface of the conductive pad, an exposed portion of the layers 102, and a portion of a conductive layer.

Referring now to FIG. 1B, a via 112 may be drilled through the conductive layers 104, 106 and the multiple layers 102 forming the HLC substrate 100 at a dedicated region of the HLC substrate 100 that is isolated from the remaining circuitry. While any size via may be implemented as appropriate, a typical via may have a through hole diameter of between about 0.010 inches and 0.020 inches. The via 112 may be plated or coated with a conductive material (e.g., copper plating) (illustrated by plating segments 108, 110). The plating typically is about 0.001 inches thick, resulting in a via hole diameter of about 0.008 inches to about 0.018 inches. Further, in at least one embodiment, the via 112 may be filled with a dielectric or conductive filler material (e.g., solvent-free epoxy, metal-filled epoxy, copper or tin plating, etc.) to prevent the introduction of material into the via during subsequent manufacturing processes. An exemplary material that may be used to fill the via 112 includes LV45 black epoxy available from Emerson & Cuming of Billerica, Mass. Cross-section view 100B illustrates a cross-section of the HLC substrate having the plated and filled via 112.

Referring now to cross-section view 100C of FIG. 1C, the filler material in the via 112 may be planarized and a conductive material (e.g., copper) may be applied to both the top and bottom surfaces of the HLC substrate 100 (i.e., the external surfaces of the conductive layers 104, 106, respectively), resulting in conductive layer 114 and conductive layer 116, respectively. As with the conductive layers 104, 106, any of a variety of techniques may be utilized to deposit the conductive material on the appropriate surface of the HLC substrate 100. Referring now to the cross-section view 100D of FIG. 1D, a photoresist layer (illustrated as photoresist segments 122–126) may be applied to the conductive layer 114 of the HLC substrate 100 such that a gap (illustrated as gap sections 128, 130) is formed around the photoresist segment 124, where the photoresist segment is substantially coaxial with the via 112. The gap may have a width of, for example, between about 0.002 to 0.025 inches. The photoresist segment 124 may be formed in any of a variety of shapes as viewed from the top surface of the HLC substrate 100. For example, the photoresist segment 124 could be formed in a substantially circular pattern, in a substantially rectangular pattern, or as otherwise appropriate given circuit design considerations. In a similar manner, a photoresist layer 118 may be applied on top of the conductive layer 116 to protect the conductive layer 116 and during a subsequent etching process. Techniques for applying photoresist material are well known to those skilled in the art.

Referring now to cross-section view 100E of FIG. 1E, the top surface of the HLC substrate 100 may be exposed to etching chemicals and light to etch the conductive layers 104, 114 (FIG. 1D), resulting in conductive segments 132–136 on the top surface of the HLC substrate. It will be appreciated by those skilled in the art that those portions of the conductive layers 104, 114 not covered by photoresist material may be etched to form a gap (represented by gap sections 138, 140) around conductive segment 134. As a result, the conductive segment 134 becomes electrically isolated from the remainder of the conductive layers 104, 114 (represented as conductive segments 132, 136). Accordingly, the conductive segment 134 may be utilized as a pad for the via 112. The conductive segment 134, therefore, is referred to herein as conductive pad 134. After etching, the photoresist material may be removed from the top and bottom surfaces as shown in the example of FIG. 1E.

Referring now to cross-section view 100F of FIG. 1F, an amount of solder paste 144 may be applied to the surface of the pad 134 using a solder stencil (illustrated by stencil segments 141, 142) or other solder-paste application technique. The design and fabrication of solder stencil, stenciling equipment and solder paste is well known in the art. Any of a variety of solder pastes may be used, including, for example, Sn63:Pb37 solder paste, Sn62:Pb36;Ag2 solder paste, SN60:Pb40 solder paste, Sn96.4:Ag3.2:Cu0.4 solder paste, Sn95.5:Ag3.8:Cu0.7 solder paste, and Sn96.5:Ag3.5 solder paste, as well as other solder pastes having rosin or aqueous flux. Cross-section view 100G of FIG. 1G shows the HLC substrate 100 after removal of the solder paste stencil, where the solder paste 144 is positioned on at least a substantial portion of the surface of the pad 134.

Referring now to cross-section view 100H of FIG. 1H, the HLC substrate 100 may be reflowed such that the solder paste 144 (FIG. 1G) melts to form a solder bump 154 on the conductive pad 134. Any of a variety of solder reflow techniques may be used. For example, depending on the melting point of the solder paste 144 used, the HLC substrate 100 could be placed in a convection reflow apparatus at a temperature of about 215 Celsius for 60 to 90 seconds. At this point, the HLC substrate 100 may be electrically and mechanically connected with a HLC substrate having a same or similar solder bump/pad type to form at least part of a multilayer package.

Referring now to cross-section view 100I of FIG. 1I, the arrangement of two HLC substrates 100 (illustrated as HLC substrates 164, 166) in forming a multilayer package is illustrated in accordance with at least one embodiment of the present invention. In the illustrated example, a solder bump 154/pad 134 is formed on a top surface 174 of the HLC substrate 166 and a solder bump 154/pad 134 is formed on a bottom surface 172 of the HLC substrate 164. As noted above, the designation of the top surface and bottom surface for the HLC substrates 164, 166 is relative.

An adhesive film 160 may be positioned between the HLC substrates 164, 166 such that the solder bumps 154 of the HLC substrates 164, 166 oppositely face each other through an aperture 162 in the adhesive film 160. The adhesive film 160 may comprise any of a variety of adhesives known to those skilled in the art. The adhesive film 160 preferably includes a B-stage, or semi-cured, adhesive film compatible with the laminate material of the HLC substrates 164, 166 such as high Tg FR4 or BT film available from Park Electrochemical Corporation of Lake Success, N.Y. The type of adhesive film 160 preferably is selected such that its melting point is compatible with the laminate material of the HLC substrates 164, 166 and/or the solder bumps 154. To illustrate, if the HLC substrates 164, 166 incorporate, for example, Nelco N4000-13 laminate material and Sn63:Pb37 solder, an adhesive film 160 having a melting point around 180 degrees C. may be appropriate. While the adhesive film 160 may be of any appropriate thickness, a typical adhesive film may be about 0.002 to 0.008 inches thick.

In at least one embodiment, the aperture 162 may be formed in the adhesive film 160 using laser drilling or another heat-generating technique such that the adhesive material surrounding the aperture 162 is cured. Molten solder resulting from a reflow of the solder bumps 154 may be maintained within the aperture 162 by the cured adhesive material, as discussed below. The aperture 162 preferably has a shape substantially similar to the pads 134 of the HLC substrates 164, 166.

The HLC substrates 164, 166 then may be laminated together by pressing the substrates 164, 166 together with the adhesive film 160 in between. As a result, the top surface 174 of the HLC substrate 166 and the bottom surface 172 of the HLC substrate 164 may be adhered to each other with the solder bumps 154 occupying the void in the adhesive film 160 caused by the aperture 162. The solder bumps 154, in at least one embodiment, may be reflowed during and/or subsequent to the lamination of the HLC substrates 164, 166, thereby electrically coupling the pad 134 of the HLC substrate 164 to the pad 134 of HLC substrate 166 through the aperture 162.

The liquid flow of the solder paste during the reflow process preferably is bound by the aperture 162, thereby preventing the solder paste from flowing onto other regions of the HLC substrates 164, 166. Accordingly, the total amount of solder paste 144 deposited on the pads 134 preferably is selected such that, when reflowed, the liquid solder remains in physical contact with both pads 134 within the aperture 162. Accordingly, when solidified, the solder forms an electrical connection between the pads 134. In many instances, the applied solder paste may lose up to 60% of its volume during reflow to form a solder bump. This reduction in the volume of the applied solder paste during reflow, as well as other process considerations, may be taken into account when determining the appropriate amount of solder paste applied.

In one embodiment, a portion of the total amount of solder paste 144 may be applied to both pads 134, thereby allowing smaller pads 134 to be used. Alternatively, in another embodiment, the total amount of solder paste 144 (FIG. 1G) may be applied to one of the pads 134 while the other remains bare. The HLC substrates 164, 166 then may be laminated together using the adhesive film 160, and the solder paste 144 on the one pad 134 may be reflowed to electrically couple both pads 134. It will be appreciated that this may result in the use of a larger pad 134 to contain the larger solder bump formed by the application of all of the solder paste to only one of the pads 134.

Referring now to FIG. 1J, a cross-section view 100J of an exemplary multilayer package resulting from an application of the process described with reference to FIGS. 1A–1I is illustrated in accordance with at least one embodiment of the present invention. In the illustrated example, the multilayer package comprises the HLC substrate 164 bonded to the HLC substrate 166 by the adhesive film 160. As illustrated, gaps 38, 40 of HLC substrates 164, 166 receive in whole or in part material of the adhesive layer 160 to strengthen the bonding of the multilayer package. Also, portions of the top surface of the HLC substrate 166 and the bottom surface of the HLC substrate 164 or irregularities in those surfaces may be embedded in the adhesive film 160 to further strengthen the mechanical bond afforded by the adhesive film 160. Further, the HLC substrates 164, 166 are mechanically and electrically connected by a solder segment 170 formed from the reflowed solder bumps 154 (FIG. 1I). Accordingly, an electrical signal may be transmitted from the conductive layer 116 of the HLC substrate 164 to the conductive layer 116 of the HLC substrate 166, and vice versa, as a result of the electrical connection formed by the vias 112, the pads 134 and the solder segment 170.

Referring now to FIGS. 2A–2D, an exemplary process for laminating and interconnecting at least two HLC substrates using solder bumps partially offset from a via is illustrated in accordance with at least one embodiment of the present invention. FIG. 2A illustrates a plan view 200A and corresponding cross-section view 200AA of an HLC substrate 200 comprising one or more conductive, insulating and/or semiconductive layers 202 that have been patterned and interconnected to form part of an overall circuit.

A conductive layer 206 may be applied to the bottom surface 205 of the layers 202 and a conductive layer 204 may be applied to the top surface 203. A via 212 may be drilled through the conductive layers 204, 206 and the multiple layers 202 forming the HLC substrate 200 at a dedicated region of the HLC substrate 200 that is isolated from the remaining circuitry. The via 212 may be plated or coated with a conductive material (e.g., copper plating) (illustrated by plating segments 208, 210). Further, in at least one embodiment, the via 212 may be filled with a filler dielectric material. The filler material in the via 212 then may be planarized and a conductive material (e.g., copper) may be applied to the bottom surface, resulting in conductive layer 216, and to the top surface, resulting in conductive layer 214.

A combined bump pad 234 may be formed from the conductive layers 204, 214, where the combined bump pad 234 includes electrically connected pads 220, 222, where the pad 222 preferably is substantially coaxial with the via 212 and the pad 220 is offset from the via 212. The processes for drilling, plating, hole filling and etching pads 220, 222 may be the same as those described with reference to FIGS. 1A–1E. A typical diameter of the pad 220 is between about 0.015 and about 0.030 inches and a typical diameter of the pad 222 is between about 0.015 and about 0.050 inches.

Referring now to cross-section view 200B of FIG. 2B, solder paste may be applied to the surface of the pad 234 using a solder stencil or other solder-paste application technique. The HLC substrate 200 then may be reflowed such that the solder paste forms a solder bump 224 on the pad 234. At this point, the HLC substrate 200 may be electrically and mechanically connected with a similar HLC substrate to form at least part of a multilayer package.

Figure 2C:
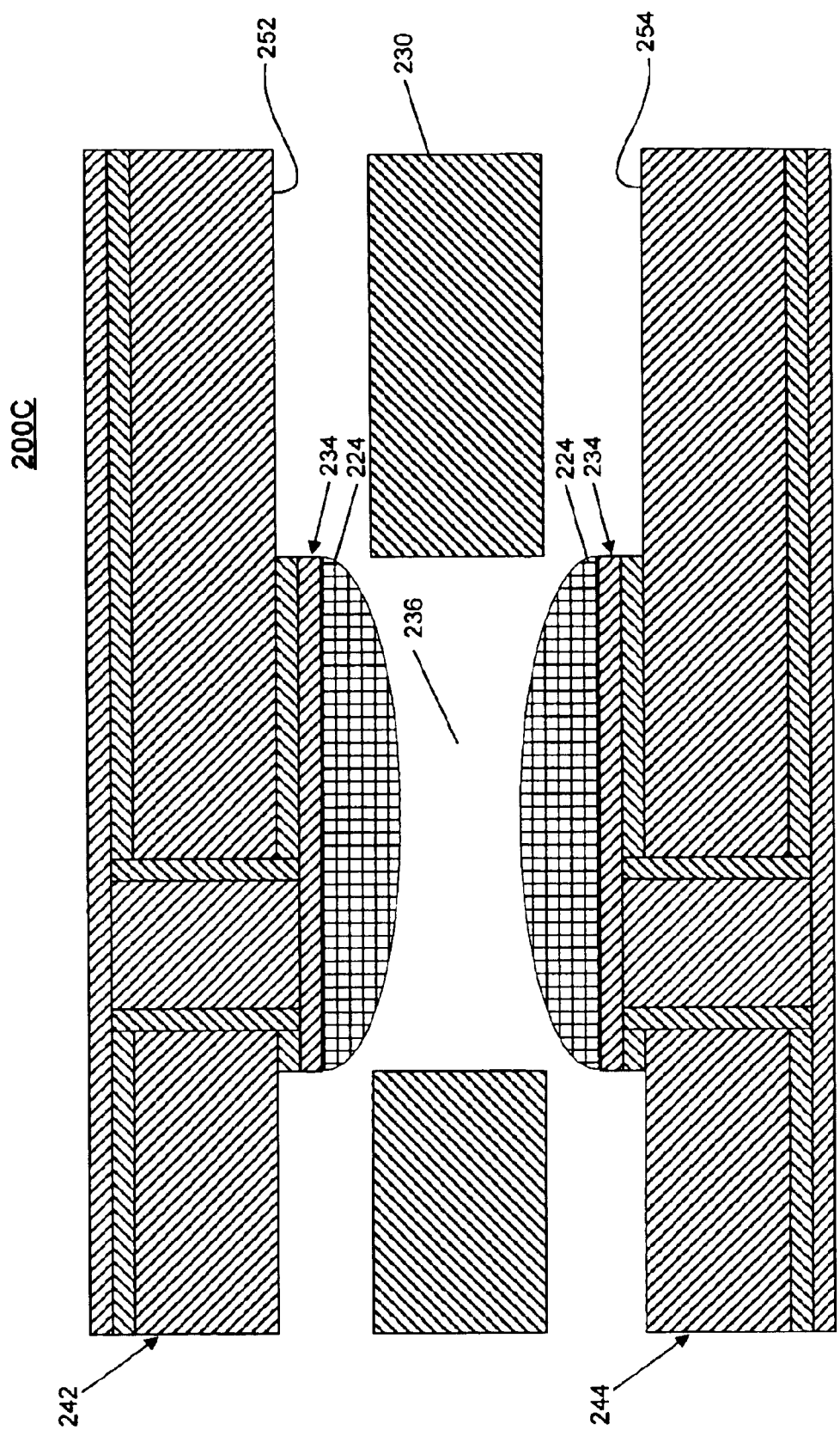

Referring now to cross-section view 200C of FIG. 2C, the arrangement of two HLC substrates 200 (illustrated as HLC substrates 242, 244) in forming a multilayer package is illustrated in accordance with at least one embodiment of the present invention. In the illustrated example, adhesive film 230 is positioned between the bottom surface 252 of the HLC substrate 242 and the top surface 254 of the HLC substrate 244 such that the solder bumps 224 of the HLC substrates 242, 244 oppositely face and confront each other through an aperture 236 in the adhesive film 230. The adhesive film 230 may comprise any of a variety of adhesives, as described above. Laser drilling or another heat-generating technique preferably may be used when forming the aperture 236 to cure the adhesive material surrounding the aperture 236. The aperture preferably has a shape complementary or substantially similar to the pads 234 of the HLC substrates 242, 244.

The HLC substrates 242, 244 may be laminated together by pressing the substrates 242, 244 together with the adhesive film 260 inbetween, thereby adhering the top surface of the HLC substrate 244 and the bottom surface of HLC substrate 242 to each other with the solder bumps 224 occupying the void in the adhesive film 230 caused by the aperture 236. The solder bumps 224 may be reflowed during and/or subsequent to the lamination of the HLC substrates 242, 244 to electrically connect the pad 234 of the HLC substrate 242 to the pad 234 of HLC substrate 244.

As discussed above, the solder paste may be applied to one or both of the pads 234 of the HLC substrates 242, 244. It will be appreciated that the solder paste of the solder bumps 224 may be contained within the aperture 236 by the adhesive film 230 and the pads 234 of the HLC substrates 242, 244. Accordingly, the total amount of solder paste applied to one or both of the pads 234 preferably is selected as to substantially fill the aperture 236.

Referring now to FIG. 2D, a cross-section view 200D of an exemplary multilayer package resulting from an application of the process described with reference to FIGS. 2A–2C is illustrated in accordance with at least one embodiment of the present invention. In the illustrated example, the multilayer package comprises the HLC substrate 242 mechanically bonded to the HLC substrate 244 by the adhesive film 230. Portions or irregularities of the top surface of the HLC substrate 244 and the bottom surface of the HLC substrate 242 may be embedded in the adhesive film 230 to further strengthen the mechanical bond afforded by the adhesive film 230. Further, the HLC substrates 242, 244 are mechanically and electrically connected by a solder segment 240 formed from the reflowed solder bumps 224 (FIG. 2C). Accordingly, an electrical signal may be transmitted from HLC substrate 242 to the HLC substrate 244, and vice versa, as a result of the electrical connection formed by the vias 212, the pads 234 and the solder segment 240.

Referring now to FIGS. 3A–3D, another exemplary process for laminating and interconnecting at least two HLC substrates using one or more solder bumps offset from a via is illustrated in accordance with at least one embodiment of the present invention. FIG. 3A illustrates a plan view 300A and corresponding cross-section view 300AA of an HLC substrate 300 comprising one or more conductive, insulating and/or semiconductive layers 202 that have been patterned and interconnected to form part of an overall circuit.

As described with reference to FIG. 2A, the conductive layers 204, 206 may be applied to the top surface 203 and bottom surface 205, respectively, of layers 202. The via 212 may be drilled through the conductive layers 204, 206 and the multiple layers 202 forming the HLC substrate 300 at a dedicated region of the HLC substrate 300 that is isolated from the remaining circuitry. The via 212 may be plated or coated with a conductive material (e.g., copper plating). Further, in at least one embodiment, the via 212 may be filled with a filler dielectric material. The filler material in the via 212 then may be planarized and a conductive material (e.g., copper) may be applied to the bottom surface, resulting in conductive layer 216, and applied to the top surface, resulting in conductive layer 214. The combined bump pad 234 (having pads 220, 222, FIG. 2A) may be formed from the conductive layers 204, 214 as described above.

Rather than forming a solder bump over the entire bump pad 234 (e.g., solder bump 224, FIG. 2B), it may be preferable to form a solder bump on only a portion of the bump pad 234 to decrease the probability of an open circuit due in part to the volume of the solder bump. In this instance, solder resist material 318 may be applied to a portion of the pad 234 to prevent solder alloy from covering the entire pad 234 when the solder paste is reflowed. Solder resist materials may include, for example, nickel, titanium, stainless steel, epoxy laminate, photoimagable epoxy, adhesive films, and the like. The solder resist material 318 may be applied to any appropriate portion of the bump pad 234. In the illustrated example, the solder resist material 318 is applied to the pad 222 (FIG. 2A) of the combined bump pad 234. The applied solder resist material 318, for example, may be about 20 to 50 micro-inches thick. After applying the solder resist material 318, solder paste then may be applied to the surface portion of the pad 234 not having solder resist material 318 using a solder stencil or other solder-paste application technique. Referring now to cross-section 300B of FIG. 3B, the HLC substrate 300 may be reflowed such that the solder paste forms a solder bump 324 on the surface portion of the pad 234 where the solder resist material 318 is absent. At this point, the HLC substrate 300 may be electrically and mechanically connected with a similar HLC substrate to form at least part of a multilayer package.

Referring now to FIG. 3C, the arrangement of two HLC substrates 300 (illustrated as HLC substrates 332, 334) in forming a multilayer package is illustrated in accordance with at least one embodiment of the present invention. In the illustrated example, adhesive film 330 may be positioned between the HLC substrates 332, 334 such that the solder bump 324 and pad 234 formed on the bottom surface 342 of the HLC substrate 332 confronts the solder bump 324 and pad 234 formed on the top surface 244 of the HLC substrate 334 through an aperture 336 in the adhesive film 330. The adhesive film 330 may comprise any of a variety of adhesives. The aperture 336 preferably has an area and/or shape substantially similar to the area and/or shape of the solder bumps 324.

The HLC substrates 332, 334 may be laminated together by pressing the substrates 332, 334 together with the adhesive film 330 inbetween, thereby adhering the top surface of the HLC substrate 334 to the bottom surface of the HLC substrate 332 with the solder bumps 324 occupying the void in the adhesive film 330 caused by the aperture 336. The solder bumps 324 may be reflowed during and/or subsequent to the lamination of the HLC substrates 332, 334 to electrically connect the pad 234 of the HLC substrate 332 to the pad 234 of the HLC substrate 334.

The solder paste may be applied to one or both of the pads 234 of the HLC substrates 332, 334. Upon reflow, the solder alloy of the solder bumps 224 typically is contained within the aperture 336 by the adhesive film 330 and the pads 234 of the HLC substrates 332, 334. Accordingly, the total amount of solder paste applied to one or both of the pads 234 preferably is selected as to substantially fill the aperture 336.

Referring now to FIG. 3D, a cross-section view 300D of an exemplary multilayer package resulting from an application of the process described with reference to FIGS. 3A–3C is illustrated in accordance with at least one embodiment of the present invention. In the illustrated example, the multilayer package comprises the HLC substrate 332 mechanically coupled to the HLC substrate 334 by the adhesive film 330. Portions or irregularities of the top surface of the HLC substrate 334 and the bottom surface of the HLC substrate 332 may be embedded in the adhesive film 330 to further strengthen the mechanical coupling afforded by the adhesive film 330. Further, the HLC substrates 332, 334 are mechanically and electrically coupled by a solder segment 340 formed from the reflowed solder bumps 324 (FIG. 3C). Accordingly, an electrical signal may be transmitted from HLC substrate 332 to the HLC substrate 334, and vice versa, as a result of the electrical connection formed by the vias 212, the pads 234 and the solder segment 340.

Figure 4A:
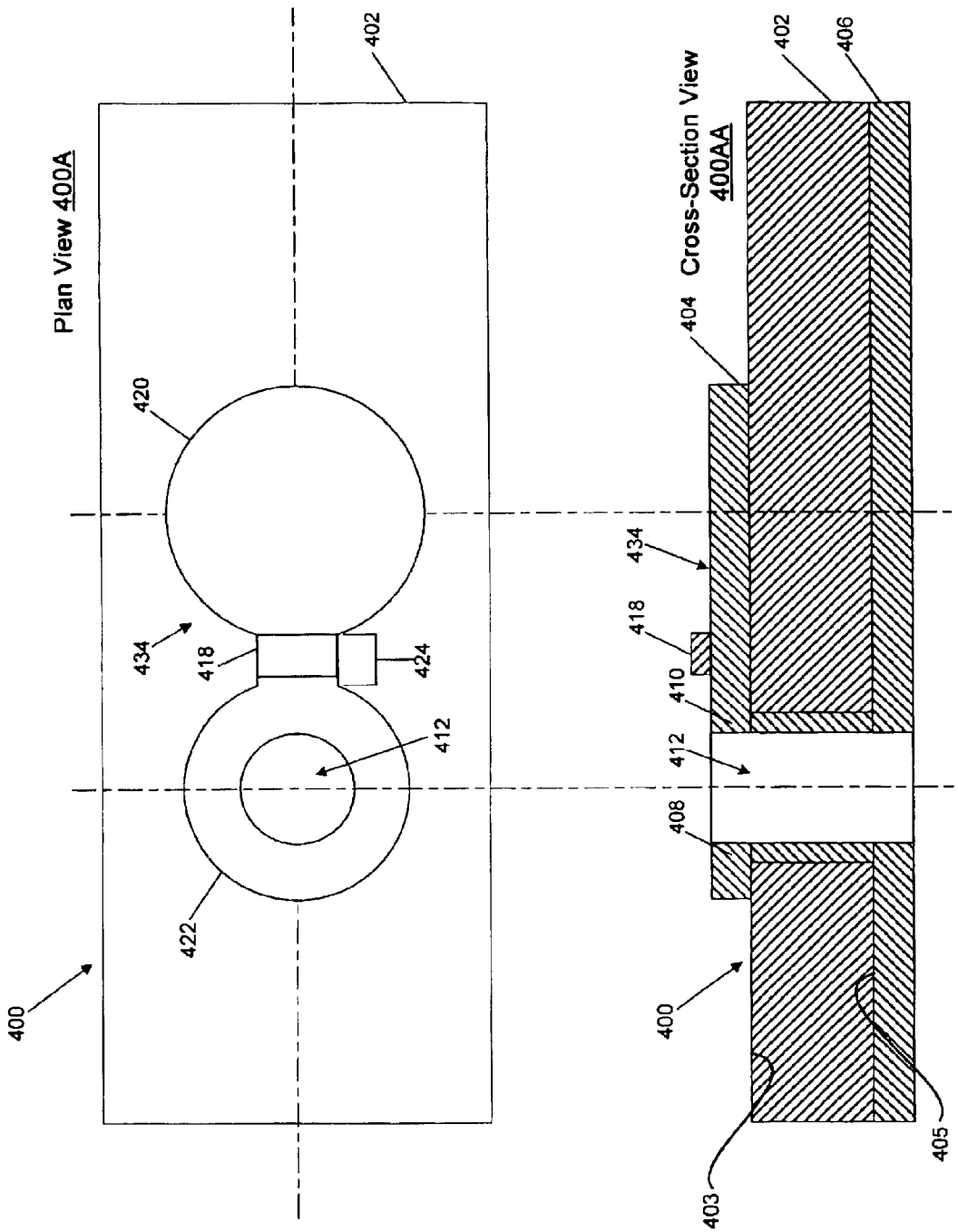
FIGS. 4A–4C are plan and cross-sectional diagrams of various manufacturing stages of an exemplary multilayer package illustrating a process of laminating and interconnecting multiple substrates by forming a solder bump offset from a via using solder resist material in accordance with at least one embodiment of the present invention.
Figure 4B:
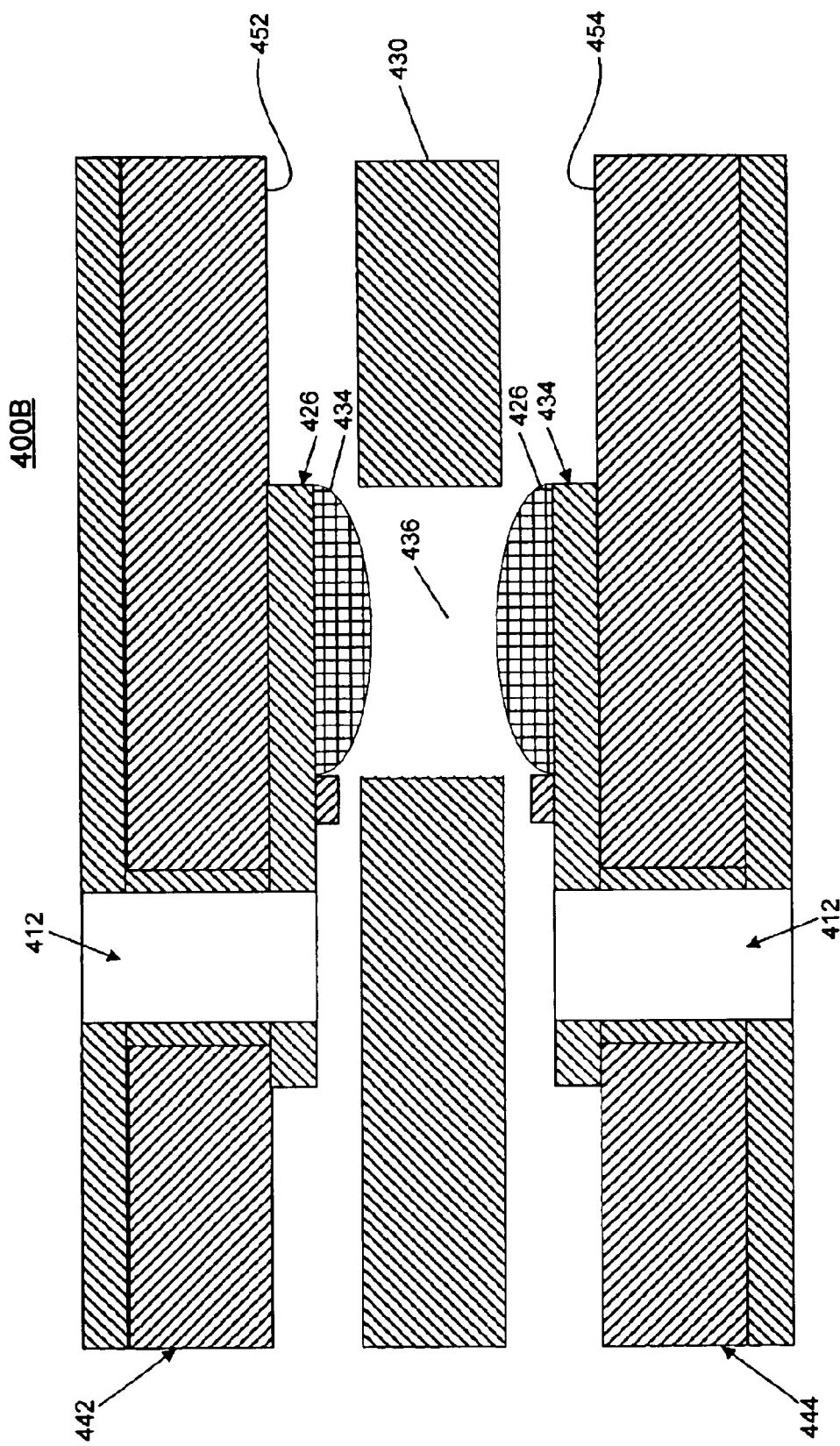
Figure 4C:
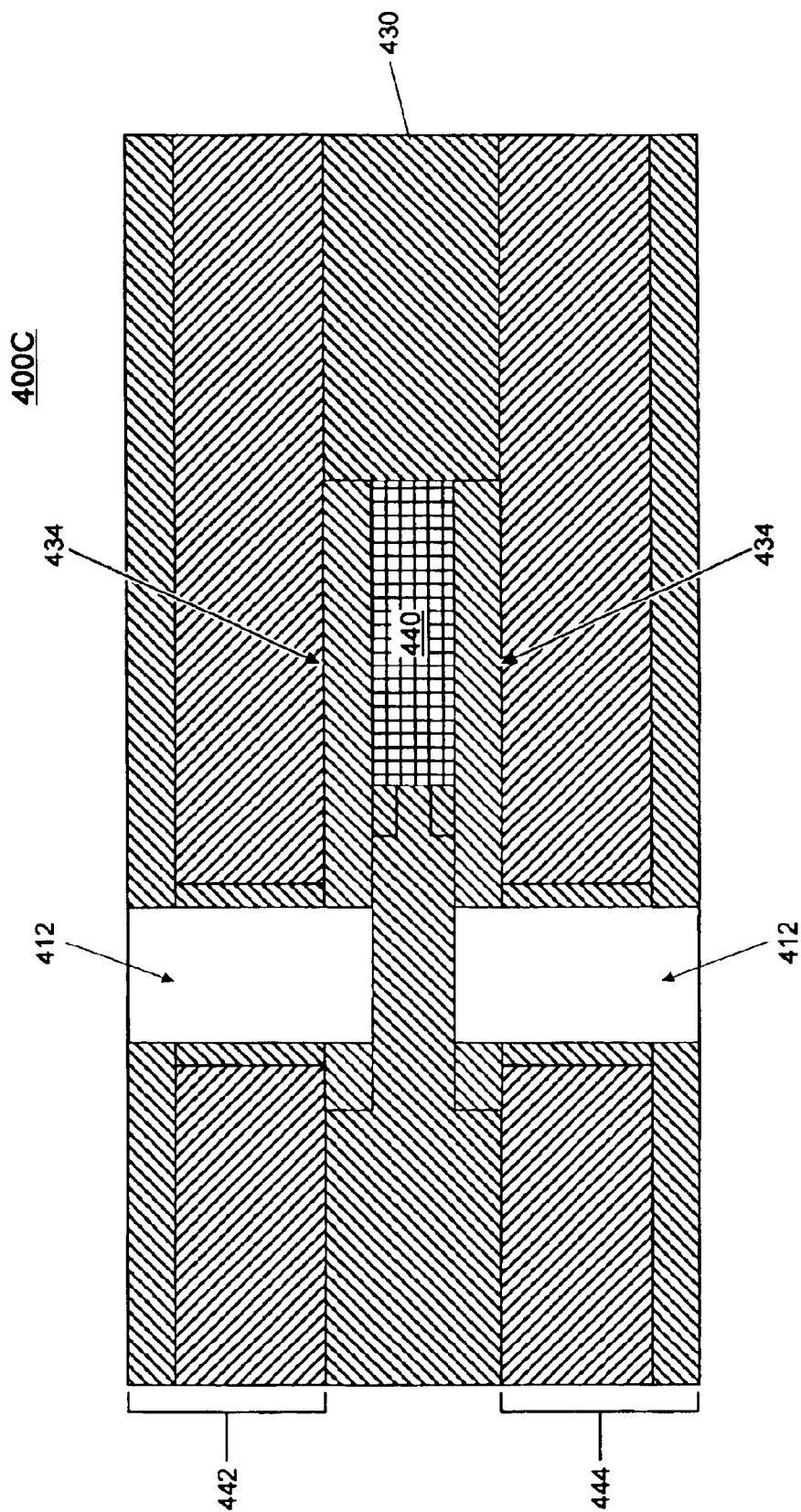

Referring now to FIGS. 4A–4C, an exemplary process for laminating and interconnecting at least two HLC substrates using solder bumps offset from a via is illustrated in accordance with at least one embodiment of the present invention. FIG. 4A illustrates a plan view 400A and corresponding cross-section view 400AA of an HLC substrate 400 comprising one or more conductive, insulating and/or semiconductive layers 402 that have been patterned and interconnected to form part of an overall circuit. A conductive layer 406 may be applied to the bottom surface 403 of the layers 402 and a conductive layer 404 may be applied to the top surface 405.

In certain circumstances, it may be beneficial to substantially offset a solder bump from a via when laminating two HLC substrates. Accordingly, a combined bump pad 434 may be formed from the conductive layer 404 on the top surface, the combined bump pad 434 preferably including a pad 420 and a pad 422 electrically connected by a pad portion 424. The pad 422 may have a diameter of, for example, about 0.015 to about 0.040 inches, the pad 420 may have a diameter of, for example, about 0.020 to about 0.060 inches. The pad portion 424 may have a length of, for example, about 0.010 to about 0.030 inches. A via 412 may be drilled through the pad 422, the conductive layers 404, 406 and the multiple layers 402 forming the HLC substrate 400 at a dedicated region of the HLC substrate 400 that is isolated from the remaining circuitry. In at least one embodiment, the via 412 is substantially coaxial to the annular-shaped pad 422. It should be understood that the vias, pads and other components may take other acceptable forms or shapes and that the particular embodiments described herein are exemplary and not limiting to the invention. The via 412 may be plated or coated with a conductive material (e.g., copper plating) (illustrated by plating segments 408, 410). In the illustrated example, the via 412 remains unfilled. In an alternate embodiment, however, a filled via may be used, whereby a via is drilled through conductive layers 404, 406 and substrate 402, the via filled with filler material, and then the pad 422 formed over the filled via.

To prevent solder alloy from covering the entire pad 434 during the formation of a solder bump (described below), solder resist material 418 may be applied to the pad portion 424 to create a barrier. After applying the solder resist material 418, solder paste then may be applied to the pad 420 using a solder stencil or other solder-paste application technique. The HLC substrate 400 then may be reflowed such that the solder paste forms a solder bump (solder bump 426, FIG. 4B) on the surface portion of the pad 420 but is prevented from flowing to the pad 422 due to the barrier formed by the solder resist material 418. At this point, the HLC substrate 400 may be electrically and mechanically connected with a similar HLC substrate to form at least part of a multilayer package.

Referring now to cross-section view 400B of FIG. 4B, the arrangement of two HLC substrates 400 (illustrated as HLC substrates 442, 444) in forming an exemplary multilayer package is illustrated in accordance with at least one embodiment of the present invention. In the illustrated example, adhesive film 430 may be positioned between the top surface 454 of the HLC substrate 444 and the bottom surface 452 of the HLC substrate 442, where the solder bumps 426 formed on the pads 434 of the HLC substrates 442, 444 confront each other through an aperture 436 in the adhesive film 430. Although FIG. 4B illustrates solder bumps 426 on both substrates 442, 444, an appropriate amount of solder paste may be applied to only one the pads 434 of the HLC substrates 442, 444. The aperture 436 preferably has a area and/or shape substantially similar or complementary to the area and/or shape of the solder bumps 426.

The HLC substrates 442, 444 may be laminated together by pressing the substrates 442, 444 together with the adhesive film 430 inbetween, thereby adhering the top surface of the HLC substrate 444 to the bottom surface of the HLC substrate 442 with the solder bumps 426 occupying the void in the adhesive film 430 caused by the aperture 436. The solder bumps 424 may be reflowed during and/or subsequent to the lamination of the HLC substrates 442, 444 to electrically couple the pad 434 of the HLC substrate 432 to the pad 434 of HLC substrate 434.

Referring now to FIG. 4C, a cross-section view 400C of an exemplary multilayer package resulting from an application of the process described with reference to FIGS. 4A–4B is illustrated in accordance with at least one embodiment of the present invention. In the illustrated example, the multilayer package comprises the HLC substrate 442 mechanically bonded to the HLC substrate 444 by the adhesive film 430. Further, the HLC substrates 442, 444 are mechanically and electrically coupled by a solder segment 440 formed from the reflowed solder bumps 426 (FIG. 4B). Accordingly, an electrical signal may be transmitted from HLC substrate 442 to the HLC substrate 444, and vice versa, as a result of the electrical connection formed by the vias 412, the pads 434 and the solder segment 440.

Figure 5A:
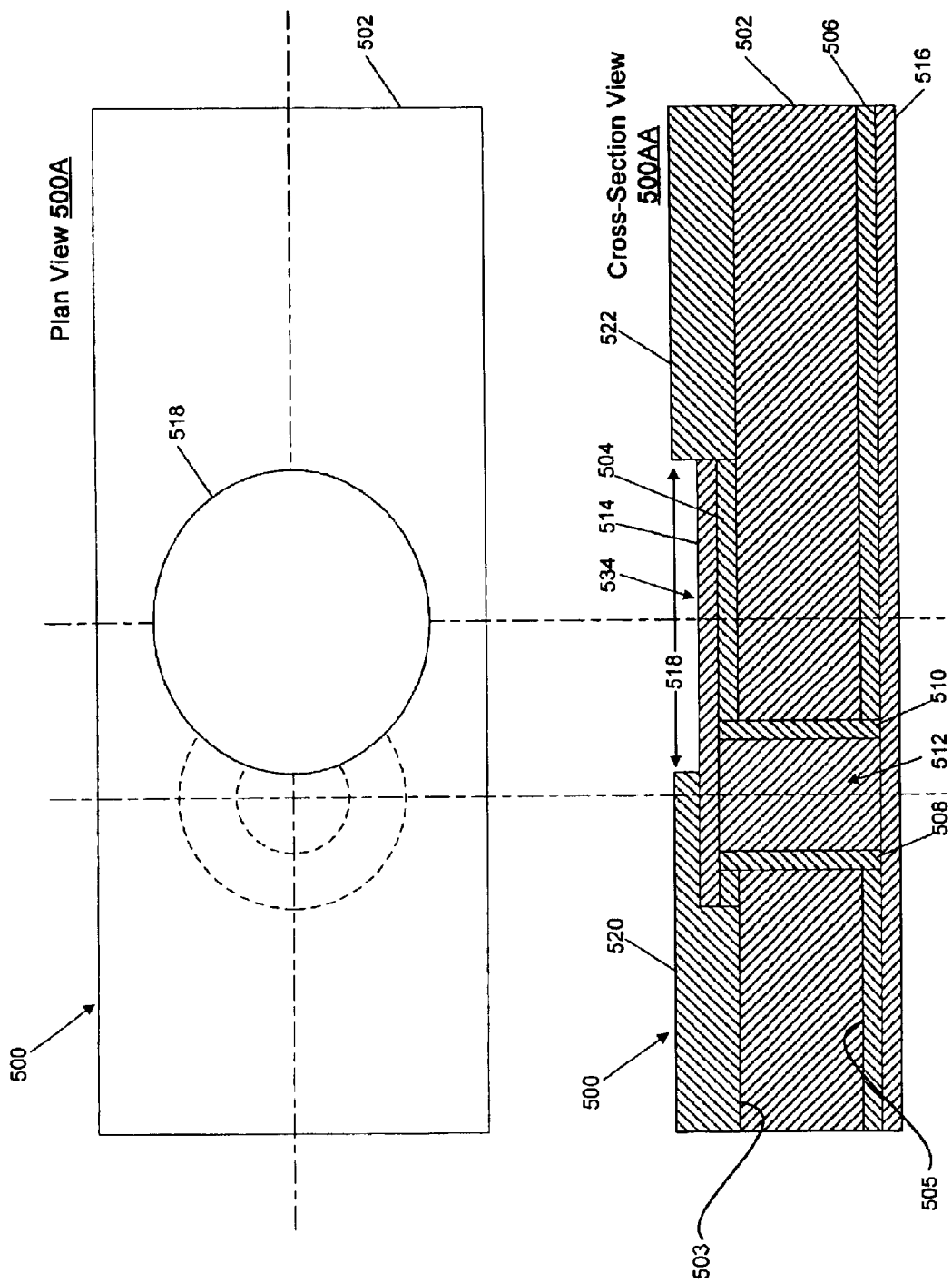
Figure 5B:
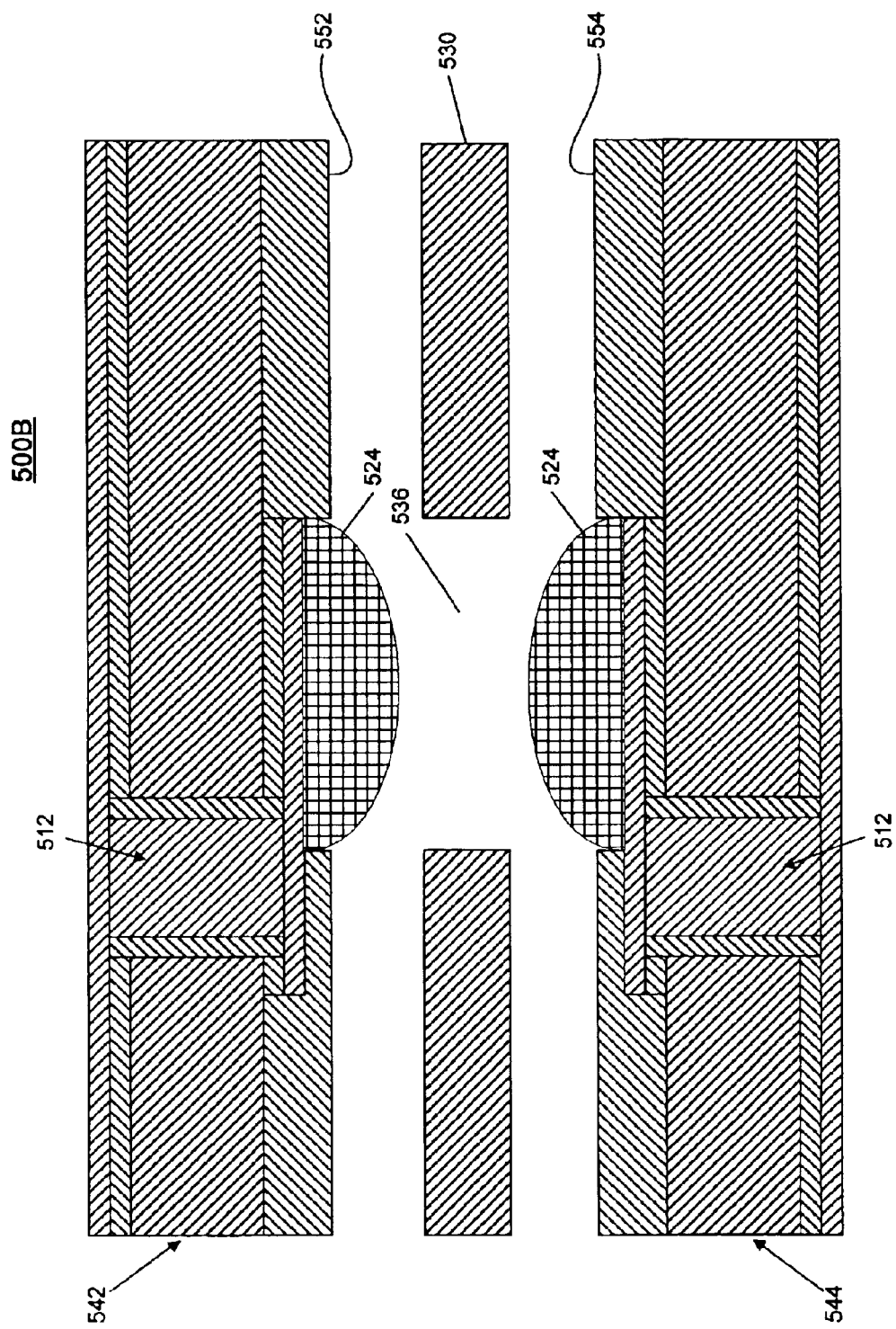

Referring now to FIGS. 5A–5C, another exemplary process for laminating and interconnecting at least two HLC substrates using solder bumps connected to vias is illustrated in accordance with at least one embodiment of the present invention. FIG. 5A illustrates a plan view 500A and corresponding cross-section view 500AA of an HLC substrate 500 comprising one or more conductive, insulating and/or semiconductive layers 502 that have been patterned and interconnected to form part of an overall circuit.

A conductive layer 506 may be applied to the bottom surface 505 of the layers 502 and a conductive layer 504 may be applied to the top surface 503. A via 512 may be drilled through the conductive layers 504, 506 and the layers 502 at a dedicated region of the HLC substrate 500 that is isolated from the remaining circuitry. The via 512 may be plated or coated with a conductive material (e.g., copper plating) (illustrated by plating segments 508, 510). Further, in at least one embodiment, the via 512 may be filled with a filler dielectric material. The filler material in the via 512 then may be planarized and a conductive material (e.g., copper) may be applied to the bottom surface, resulting in conductive layer 516, and the top surface, resulting in conductive layer 514. A bump pad 534 may be formed from the conductive layers 504, 514, as described above. The processes for drilling, plating, hole filling and etching pads 220, 222 may be the same as those described above.

An insulative material (represented by insulative material portions 520, 522) then may be applied to the top surface of the HLC substrate 500. Exemplary insulative materials may include high Tg FR4, BT, polymide, cyanate ester, photo-imageable epoxy, and the like. An aperture 518 may be formed in a portion of the insulative material covering the pad 534 such that a portion of the surface of the pad 534 is accessible through the aperture 518 in the insulative material. The insulative material may have a thickness of, for example, about 0.002 to about 0.004 inches. Further, due to the presence of the insulative material, it may be beneficial to use a thinner adhesive film 530 of about 0.0001 to about 0.0002 inches thick.

Solder paste may be applied to the accessible surface portion of the pad 534. It will be appreciated that the aperture 518 may act as a solder stencil, allowing solder paste to be applied to the accessible surface portion but preventing the application of solder paste to the surface portions of the HLC substrate 500 covered by the insulative material. The HLC substrate 500 then may be reflowed such that the solder paste forms a solder bump (solder bump 524, FIG. 5B) on the accessible surface portion of the pad 534. At this point, the HLC substrate 500 may be electrically and mechanically connected with a similar HLC substrate to form at least part of a multilayer package.

Referring now to cross-section 500B of FIG. 5B, the arrangement of two HLC substrates 500 (illustrated as HLC substrates 542, 544) in forming a multilayer package is illustrated in accordance with at least one embodiment of the present invention. In the illustrated example, an adhesive film 530 may be positioned between the bottom surface 552 of the HLC substrate 542 and the top surface 554 of the HLC substrate 544 such that the solder bumps 524 of the HLC substrates 542, 544 confront each other through an aperture 536 in the adhesive film 530. The aperture preferably has a shape complementary or substantially similar to the aperture 518 (FIG. 5A).

The HLC substrates 542, 544 then may be laminated together by pressing the substrates 542, 544 together with the adhesive 560 inbetween, thereby adhering the top surface of the HLC substrates 544 to the bottom surface of the HLC substrate 542 with the solder bumps 224 occupying the void in the adhesive film 530 caused by the aperture 536. The solder bumps 524 may be reflowed during and/or subsequent to the lamination of the HLC substrates 542, 544 to electrically couple the pad 534 of the HLC substrate 532 to the pad 534 of HLC substrate 534.

Referring now to FIG. 5C, a cross-section view 500C of an exemplary multilayer package resulting from an application of the process described with reference to FIGS. 5A and 5B is illustrated in accordance with at least one embodiment of the present invention. In the illustrated example, the multilayer package comprises the HLC substrate 542 mechanically coupled to the HLC substrate 544 by the adhesive film 530. Portions or irregularities of the top surface of the HLC substrate 544 and the bottom surface of the HLC substrate 542 may be embedded in the adhesive film 530 to further strengthen the mechanical bonding afforded by the adhesive film 530. Further, the HLC substrates 542, 544 are mechanically and electrically coupled by a solder segment 540 formed from the reflow of the solder bumps 524 (FIG. 5B). Accordingly, an electrical signal may be transmitted from the HLC substrate 542 to the HLC substrate 544, and vice versa, as a result of the electrical connection formed by the vias 512, the pads 534 and the solder segment 540.

Figure 6A:
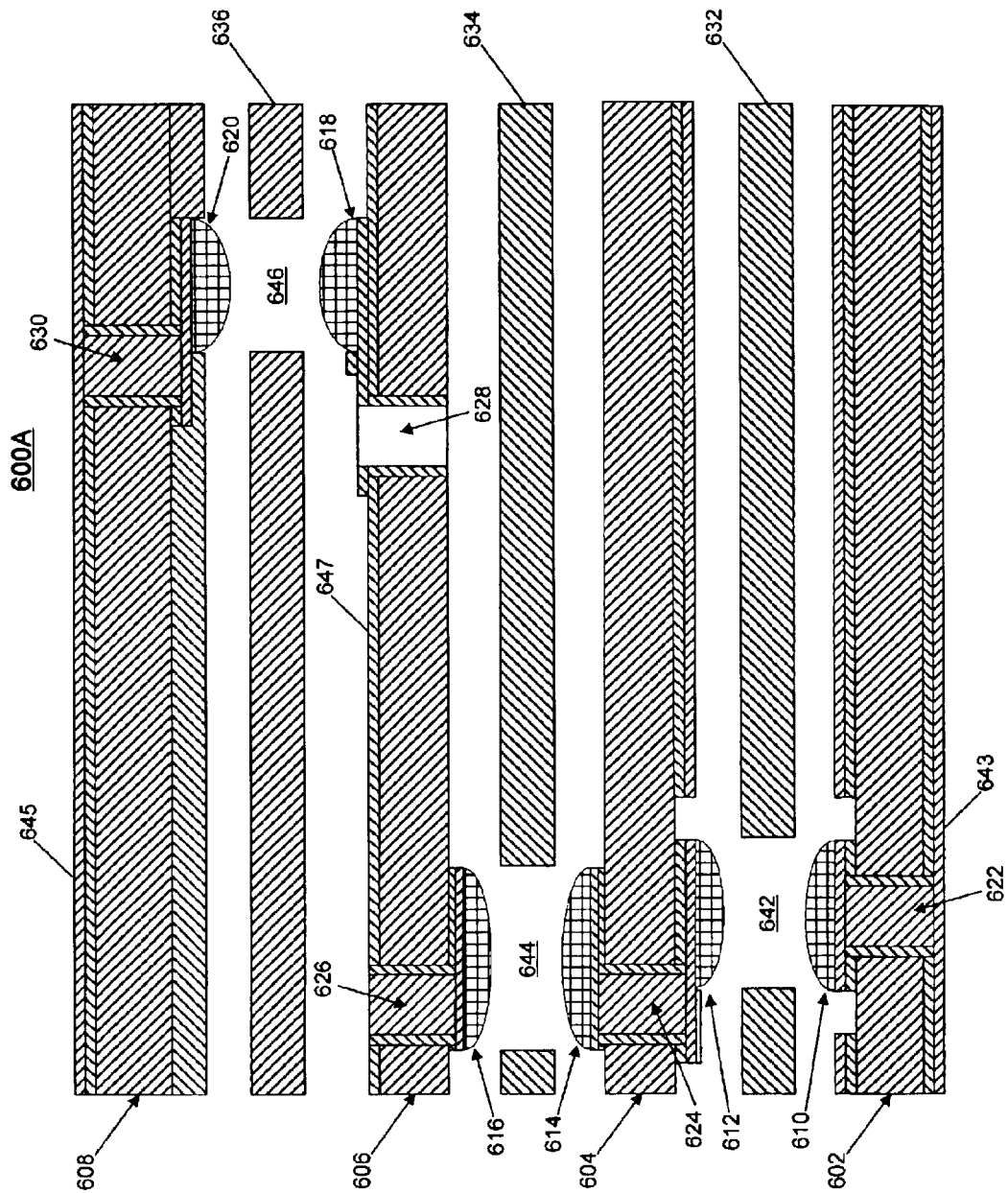
FIGS. 6A and 6B are cross-sectional diagrams of various manufacturing stages of an exemplary multilayer package illustrating a process of laminating and interconnecting multiple substrates having the exemplary solder bumps described with reference to FIGS. 1A–5C in accordance with at least one embodiment of the present invention.
Figure 6B:
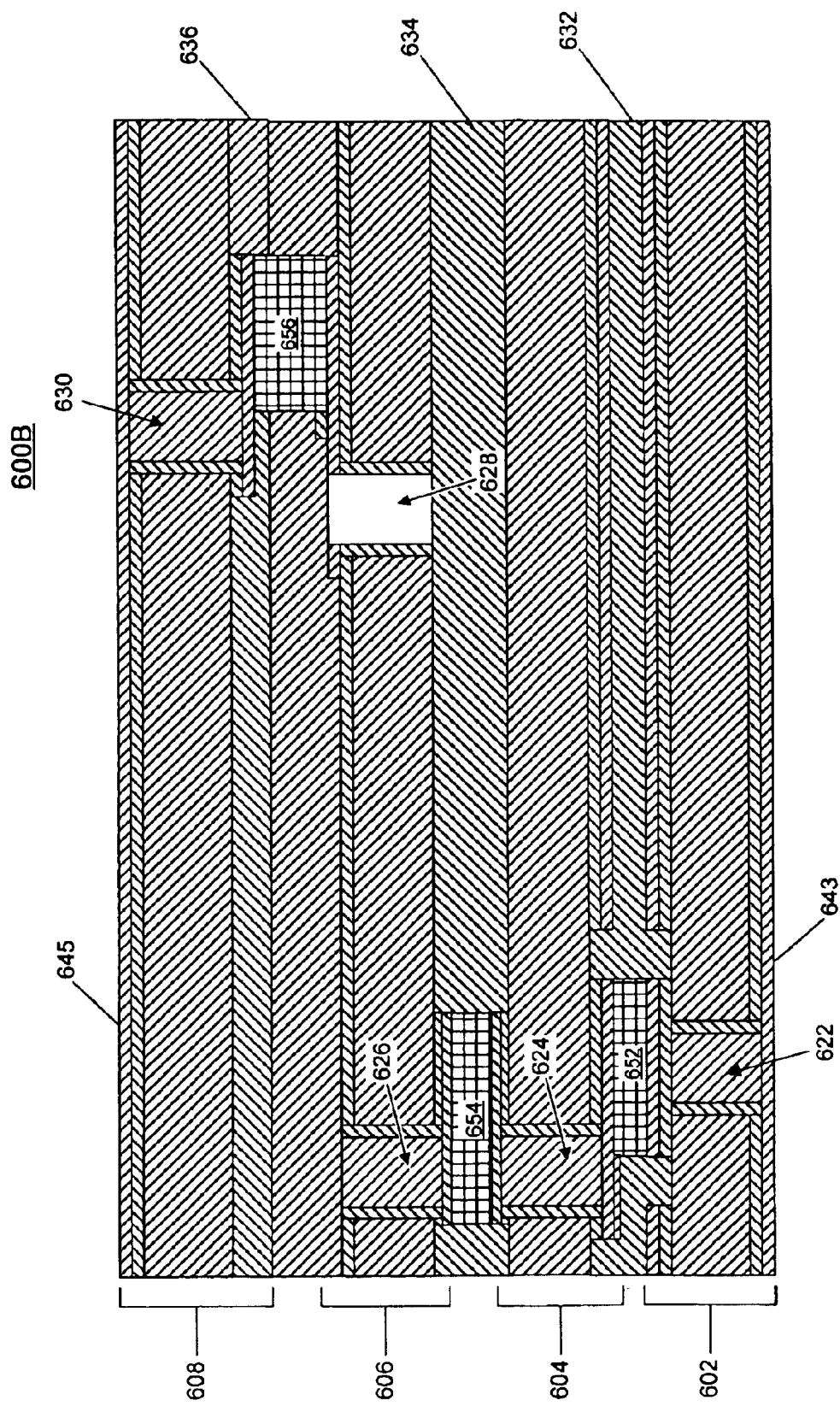

Although FIGS. 1A–5C illustrate exemplary embodiments whereby HLC substrates are laminated together using the same type of solder bump/pad/via, various combinations of solder bump/pad/via types may be utilized to laminate and interconnect HLC substrates without departing from the spirit or the scope of the present invention. Likewise, although FIGS. 1A–5C illustrate exemplary processes of laminating two HLC substrates, more than two substrates may be laminated using the techniques described herein. FIGS. 6A and 6B illustrate an exemplary multilayer package having four HLC substrates laminated and interconnected using the various solder bump/pad/via combinations described above.

Referring now to FIG. 6A, cross-section view 600A illustrates a cross-section of HLC substrates 602–608 prior to lamination to create an exemplary multilayer package in accordance with at least one embodiment of the present invention. In the illustrated example, the multilayer package is created by laminating HLC substrates 602–608 using adhesive films 632–636. The HLC substrate 602 includes a solder bump/bump pad 610 electrically connected to a bottom conductive layer 643 by a via 622. The solder bump/bump pad 610 may be formed using the exemplary technique described in FIGS. 1A–1H. The HLC substrate 604 includes an interconnect having a solder bump/bump pad 612 on the bottom surface and a solder bump/bump pad 614 the top surface and electrically connected by a via 624. The solder bump/bump pad 612 may be formed using the exemplary technique described in FIGS. 3A and 3B and the solder bump/bump pad 614 may be formed using the exemplary technique described in FIGS. 2A and 2B. The HLC substrate 606 includes an interconnect having a solder bump/bump pad 616 (bottom surface), solder bump/bump pad 618 (top surface) and vias 626, 628 electrically connected by a conductive layer 647. The solder bump/bump pad 616 may be formed in a manner similar to the solder bump/bump pad 614 and the solder bump/bump pad 618 may be formed using the exemplary technique described in FIGS. 4A and 4B. In the illustrated example, the via 626 includes a filled via (e.g., via 112, FIG. 1B) and the via 628 includes an unfilled via (e.g., via 412, FIG. 4A). The HLC substrate 608 includes an interconnect having a via 630 electrically connecting a top conductive layer 645 with a solder bump/bump pad 620 on the bottom surface. The solder bump/bump pad 620 may be formed using the exemplary technique described in FIGS. 5A and 5B.

The HLC layers 602–608 may be laminated together to form a multilayer package using the adhesive films 632–636 such that the solder bump/bump pads of each successive layer confronts a solder bump/bump pad from the previous layer. As demonstrated in the illustrated example, the solder bump/bump pad 610 confronts the solder bump/bump pad 612 through an aperture 642 in the adhesive film 632, the solder bump/bump pad 614 confronts the solder bump/bump pad 616 through an aperture 644 in the adhesive film 634, and the solder bump/bump pad 618 confronts the solder bump/bump pad 620 through an aperture 646 in the adhesive film 636.

The HLC substrates 602–608 may be pressed together such that their surfaces come in contact with, and preferably are embedded in, the corresponding adhesive film to form a mechanical bond between each HLC layer and the next HLC layer and the solder bumps occupy the voids in the adhesive formed by the apertures. During and/or after pressing together the laminates, the solder bumps may be reflowed to electrically connect each HLC substrate with the adjacent substrate, as discussed above.

Referring now to FIG. 6B, a cross-section view 600B of an exemplary multilayer package resulting from the process of FIG. 6A is illustrated in accordance with at least one embodiment of the present invention. As illustrated, the HLC substrates 602–608 are mechanically bonded together by adhesive films 632–636. Each HLC substrate is electrically connected with its adjacent HLC substrate as a result of the reflowed solder bumps. The HLC substrate 602 is electrically connected to HLC substrate 604 by a solder segment 652 formed by the reflow of solder bumps 610, 612. The HLC substrate 604 is electrically connected to the HLC substrate 606 by a solder segment 654 formed by the reflow of solder bumps 614, 616. The HLC substrate 606 is electrically connected to the HLC substrate 608 by a solder segment 656 formed by the reflow of solder bumps 618, 620. A signal, therefore, may be conducted, for example, from the bottom conductive layer 643 to the top conductive layer 645, and among the substrates 602–608, by way of the electrical connection between the vias 622–630 and the solder segments 652–656.

As discussed above, the techniques for laminating multiple HLC substrates may involve the joining of two substrates using an interposed adhesive. When pressing together the substrates, the preferred pressure is approximately 350 to 380 pounds per square inch (psi), but any amount of pressure that effectively produces reliable electrical and mechanical bonding between the HLC substrates may be used. The lamination temperature while the substrates are under pressure preferably is about 360° F. for about 15 minutes, ramped up to 385° F. in 5 minutes and held there for about 45 minutes. The pressure preferably is then removed, and the temperature preferably is held at about 375° F. for about 20 minutes. Other lamination pressures, temperatures, and time of pressure/temperature application may be utilized without departing from the spirit or the scope of the present invention. It will be appreciated that, depending on the temperature used during lamination, there is a potential to negatively effect the substrate layers during a reflow of the solder paste. Accordingly, a solder having a relatively low melting point (e.g., below 361° F.) preferably is used to allow a lower temperature to be used during lamination.

Various embodiments of the present invention provide the ability to repair suspect, e.g., open, faulty or questionable, connections between substrates by reflowing the electrical joints formed by the solder bumps from outside. The suspect connection may be raised to a temperature slightly greater than the melting point of the solder used in the bump, thereby reflowing the solder without affecting circuit components of the substrates due to the relatively low melting point of the solder used in the bumps. Note that the mechanical connection between the substrates typically would not be affected by the increase in temperature during the repair process as the adhesive (e.g., B-stage adhesive) generally flows little, if at all, thereby preserving the precise alignment of substrates in the multilayer package. The present invention therefore provides a process of forming a multilayer substrate from two or more independently fabricated and tested substrates. The process allows connection to be made with tight tolerances, and reliable electrical and mechanical connections are achieved. Reflowing the electrical joints from the outside can repair suspect or open connections. The invention is particularly useful to bond HLC substrates and substrates with high aspect ratios.

Other embodiments, uses, and advantages of the invention will be apparent to those skilled in the art from consideration of the specification and practice of the invention disclosed herein. The specification and drawings should be considered exemplary only, and the scope of the invention is accordingly intended to be limited only by the following claims and equivalents thereof.

What is claimed is:

1. A process for interconnecting at least two high-layer-count (HLC) substrates comprising the steps of:

forming a first via in a first HLC substrate and a second via in a second HLC substrate, the first via extending through at least a portion of the first HLC substrate to a bottom surface of the first HLC substrate and the second via extending through at least a portion of the second HLC substrate to a top surface of the second HLC substrate;

forming a first conductive pad on the bottom surface of the first HLC substrate and a second conductive pad on the top surface of the second HLC substrate, the first conductive pad being in electrical contact with the first via and the second conductive pad being in electrical contact with the second via;

applying solder paste to a surface of the first conductive pad;

reflowing the solder paste to form a first solder bump on the first conductive pad;

positioning an adhesive film between the bottom surface of the first HLC substrate and the top surface of the second HLC substrate, the adhesive film having an aperture substantially located between the first solder bump and the second conductive pad;

pressing the first HLC substrate and the second HLC substrate together to adhere at least a portion of the bottom surface of the first HLC substrate to at least a portion of the top surface of the second HLC substrate and where the first solder bump occupies at least a portion of the aperture in the adhesive film; and reflowing the first solder bump to form at least part of a solder segment providing an electrical connection between the first and second conductive pads.

2. The process as in claim 1, wherein the first conductive pad is substantially coaxial with an axis of the first via.

3. The process as in claim 1, wherein the first conductive pad is offset from an axis of the first via.

4. The process as in claim 1, further comprising applying solder resist material to a portion of the first conductive pad.

5. The process as in claim 4, wherein the aperture in the adhesive film is positioned substantially between the second conductive pad and a portion of the first conductive pad without the solder resist material.

6. The process as in claim 5, wherein forming the first solder bump includes:

applying solder paste to the portion of the first conductive pad without the solder resist material; and reflowing the solder paste to form the first solder bump on the portion of the first conductive pad.

7. The process as in claim 1, wherein the step of forming the first conductive pad includes the steps of:

forming a first pad section on the top surface of the first HLC substrate, the first pad section being in electrical contact with the first via; and forming a second pad section on the top surface of the first HLC substrate; and forming a connective portion on the top surface of the HLC substrate, the connective portion being in electrical contact with the first and second pad portions.

8. The process as in claim 7, wherein the aperture in the adhesive film is located substantially between the second pad section of the first conductive pad and the second conductive pad.

9. The process as in claim 8, wherein the step of applying solder paste includes applying solder paste to the second pad section.

10. The process as in claim 9, further comprising the step of applying solder resist material to a portion of the first conductive pad.

11. The process as in claim 1, further comprising the step of applying an insulative layer over at least a portion of the bottom surface and first conductive pad of the first HLC substrate, the insulative layer including an aperture over a portion of the first conductive pad.

12. The process as in claim 11, wherein the aperture in the adhesive film is substantially coaxial with the aperture in the insulative layer.

13. The process as in claim 12, wherein the step of applying solder paste includes applying solder paste to a portion of the first conductive pad exposed by the aperture in the insulative layer.

14. The process as in claim 1, wherein the solder paste comprises one of a group consisting of: Sn63:Pb37, Sn62:Pb36:Ag2, Sn60:Pb40, Sn96.4:Ag3.2:Cu0.4, Sn95.5:Ag3.8:Cu0.7, and Sn96.5:Ag3.5 solder pastes.

15. The process as in claim 1, wherein the adhesive film comprises B-stage adhesive.

16. The process as in claim 1, further comprising:

applying solder paste to a surface of the second conductive pad;

reflowing the solder paste to form a solder bump on the second conductive pad;

positioning the adhesive film such that the aperture is substantially located between the first solder bump and the second solder bump; and reflowing the first and second solder bumps to form at least part of the solder segment providing an electrical connection between the first and second conductive pads.

17. The process as in claim 1, further comprising the step of applying conductive material to a wall of at least one of the first and second vias.

18. The process as in claim 17, further comprising the step of filling the at least one of the first and second vias with dielectric material.

* * * * *